(12) United States Patent
Nakamura et al.

(10) Patent No.: US 6,914,807 B2
(45) Date of Patent: Jul. 5, 2005

(54) MAGNETIC LOGIC ELEMENT AND MAGNETIC LOGIC ELEMENT ARRAY

(75) Inventors: Shiho Nakamura, Kanagawa-ken (JP); Shigeru Haneda, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 161 days.

(21) Appl. No.: 10/401,676

(22) Filed: Mar. 31, 2003

(65) Prior Publication Data

US 2003/0227807 A1 Dec. 11, 2003

(30) Foreign Application Priority Data

Mar. 29, 2002 (JP) .......................................... 2002-097445

(51) Int. Cl.$^7$ .......................... G11C 11/00; G11C 11/14; G11C 11/15
(52) U.S. Cl. .......................... 365/158; 365/171; 365/173
(58) Field of Search ................................ 365/158, 171, 365/173

(56) References Cited

U.S. PATENT DOCUMENTS 5,864,498 A * 1/1999 Womack ..................... 365/171
6,480,412 B1 * 11/2002 Bessho et al. ............... 365/173
6,646,530 B2 * 11/2003 Ruhrig ....................... 365/158
6,717,843 * 4/2004 Thewes et al. .............. 365/158
6,762,954 * 7/2004 Edelstein .................... 365/173

* cited by examiner

Primary Examiner—Trong Phan
(74) Attorney, Agent, or Firm—Oblon, Spivak, McClelland, Maier & Neustadt, P.C.

(57) ABSTRACT

A magnetic logic element comprises a magnetic logic element cell having; a first and second magnetic parts; a MR intermediate part provided between the first and second magnetic parts. The magnetic logic element further includes a magnetization controlling part that controls a relation of directions of magnetizations of the first and second magnetic parts in accordance with a combination of a first binary input data and a second binary input data. A binary output data can be read by detecting a magnetoresistance effect of the first and second magnetic parts through the MR intermediate part.

17 Claims, 21 Drawing Sheets

FIG.13B NOR
FIG.13D OR

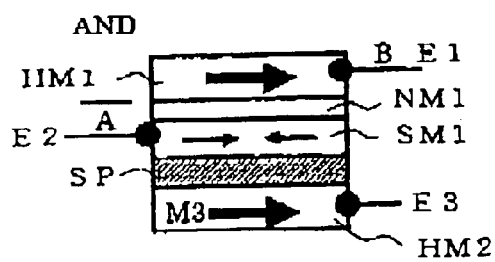
FIG.17A
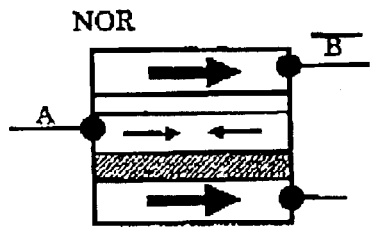
FIG.17E
| A\B | 0 | 1 |
|---|---|---|
| 0 | 0 | 0 |
| 1 | 0 | 1 |
FIG.17B
| A\B | 0 | 1 |
|---|---|---|
| 0 | 1 | 0 |
| 1 | 0 | 0 |
FIG.17F
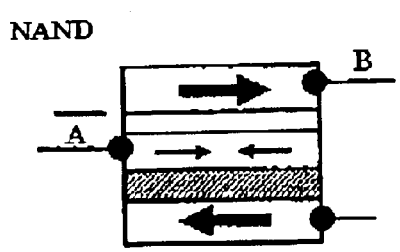
FIG.17C
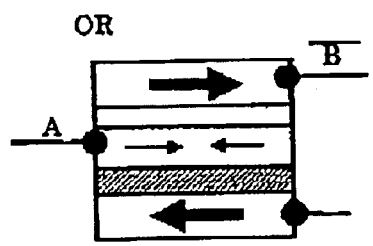
FIG.17G
| A\B | 0 | 1 |
|---|---|---|
| 0 | 1 | 1 |
| 1 | 1 | 0 |
FIG.17D
| A\B | 0 | 1 |
|---|---|---|
| 0 | 0 | 1 |
| 1 | 1 | 1 |
FIG.17H

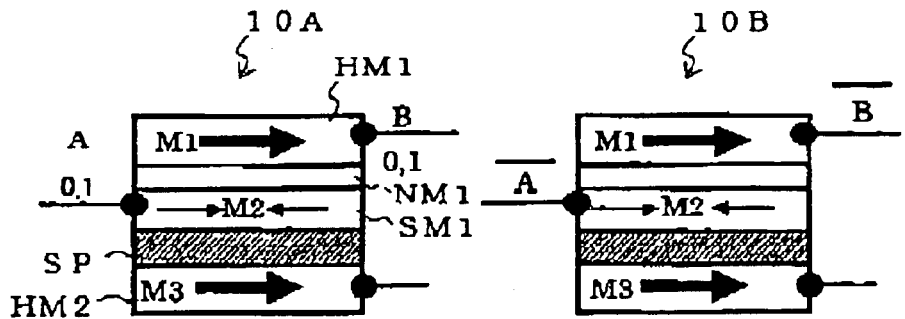
FIG.18A  FIG.18C
FIG.18B  FIG.18D
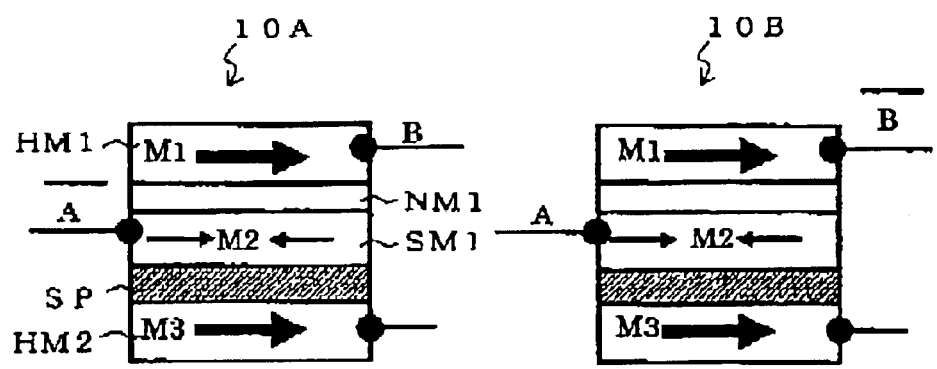
FIG.19A  FIG.19C
FIG.19B  FIG.19D FIG.23A
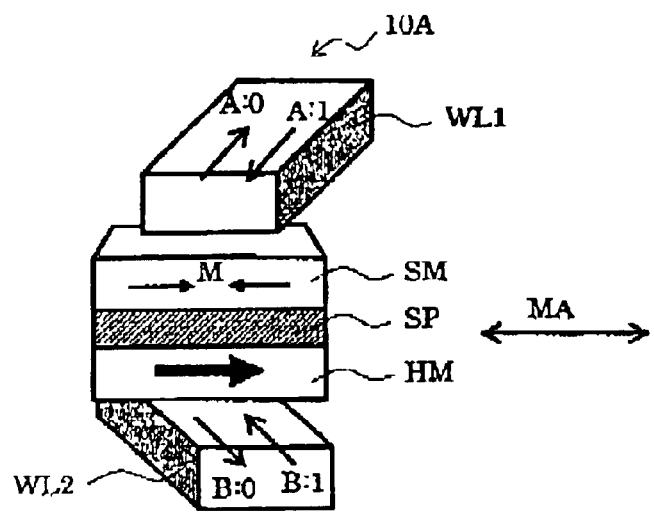
FIG.23B
| A\B | 0 | 1 |
|---|---|---|
| 0 | 1 | 1 |
| 1 | 1 | 0 |
FIG.23C
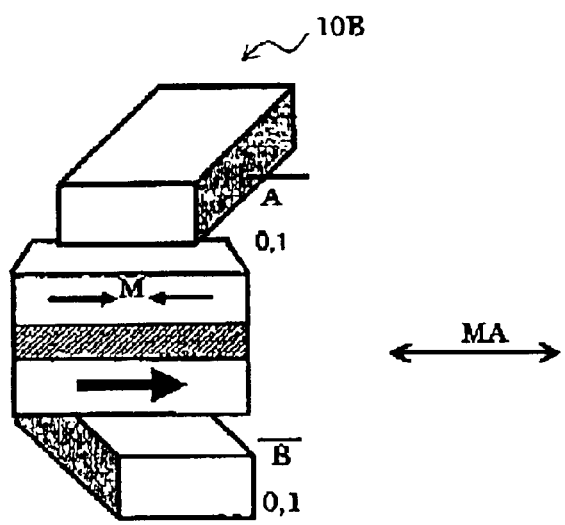
FIG.23D
| A\B | 0 | 1 |
|---|---|---|
| 0 | 0 | 1 |
| 1 | 1 | 1 |

MAGNETIC LOGIC ELEMENT AND MAGNETIC LOGIC ELEMENT ARRAY

CROSS-REFERENCE TO RELATED APPLICATIONS

This application is based upon and claims the benefit of priority from the prior Japanese Patent Application No. 2002-097445, filed on Mar. 29, 2002; the entire contents of which are incorporated herein by reference.

BACKGROUND OF THE INVENTION

This invention relates to a magnetic logic element and magnetic logic element array. More particularly, the invention relates to a magnetic logic element in which a recording of a direct-current-driving type and a reproduction by the magnetoresistance effect are possible, and a magnetic logic element array.

Since the discovery that giant magnetoresistance effect (MR) is exhibited when a current is supplied to flow in parallel with the major plane of a multi-layered structure, efforts have been paid to find systems having still larger magnetoresistance ratios. Heretofore, ferromagnetic tunnel junction elements and CPP (current-perpendicular-to-plane) type MR elements in which electric current flows vertically in a multi-layered structure have been developed and regarded hopeful as magnetic sensors and reproducing elements of for magnetic recording.

Recently, "magnetic nanocontacts" by tip-to-tip abutment of two nickel (Ni) needles and nanocontacts by contact of two magnetite elements were reported as elements exhibiting 100% or higher magnetoresistance effects in the literatures, (1) N. Garcia, M. Munoz and Y. W. Zhao, Physical Review Letters, vol.82, p2923 (1999) and (2) J. J. Versluijs, M. A. Bari and J. M. D. Coey, Physical Review Letters, vol. 87, p26601-1 (2001), respectively.

These magnetoresistance effect elements can be used not only as a reproduction element of a magnetic sensor or a magnetic record reproduction system, but also as an element of a non-volatile magnetic memory. However, these conventional elements functions only as a sensor or a memory.

On the other hand, a semiconductor device represented by silicon (Si) device is widely used not only as a memory device but as a logic circuit. However, these semiconductor circuit elements have small career concentration, and their resistance is essentially high. Therefore, integration increases power consumption. In addition, malfunction caused by downsizing also poses a problem. When using these semiconductor devices for a logic circuit, it is necessary to combine two or more transistors for one logic processing. Therefore, the further miniaturization is difficult.

SUMMARY OF THE INVENTION

According to an embodiment of the invention, there is provided a magnetic logic element comprising a magnetic logic element cell having; a first and second magnetic parts; a MR intermediate part provided between the first and second magnetic parts; and a magnetization controlling part that controls a relation of directions of magnetizations of the first and second magnetic parts in accordance with a combination of a first binary input data and a second binary input data, wherein a binary output data is able to read by detecting a magnetoresistance effect of the first and second magnetic parts through the MR intermediate part.

According to other embodiment of the invention, there is provided a magnetic logic element comprising: a first hard magnetic part including a first ferromagnetic substance pinned in magnetization substantially in a first direction; a second hard magnetic part including a second ferromagnetic substance pinned in magnetization substantially in a second direction; a MR intermediate part provided between the first and second hard magnetic parts; a first soft magnetic part provided between the first hard magnetic part and the MR intermediate part, and having a third ferromagnetic substance; a second soft magnetic part provided between the second hard magnetic part and the MR intermediate part, and having a fourth ferromagnetic substance; a first spin transfer intermediate part provided between the first hard magnetic part and the first soft magnetic part; a second spin transfer intermediate part provided between the second hard magnetic part and The second soft magnetic part; and a controlling unit which passes a first writing current between the first hard magnetic part and the first soft magnetic part in correspondence with a first logic input signal to direct a magnetization of the third ferromagnetic substance in a direction substantially parallel or anti-parallel to the first direction, the controlling unit passing a second writing current between the second hard magnetic part and the second soft magnetic part in correspondence with a second logic input signal to direct a magnetization of the fourth ferromagnetic substance in a direction substantially parallel or anti-parallel to the second direction, and the controlling unit reading a logic output based on a relative relation of the directions of magnetizations of the third and fourth ferromagnetic substances, by passing a sense current between the first and second soft magnetic parts.

According to other embodiment of the invention, there is provided a magnetic logic element comprising: a first hard magnetic part including a first ferromagnetic substance pinned in magnetization substantially in a first direction; a second hard magnetic part including a second ferromagnetic substance pinned in magnetization substantially in a second direction; a MR intermediate part provided between the first and second hard magnetic parts; a first soft magnetic part provided between the first hard magnetic part and the MR intermediate part, and having a third ferromagnetic substance; a second soft magnetic part provided between the second hard magnetic part and the MR intermediate part, and having a fourth ferromagnetic substance; a first spin transfer intermediate part provided between the first hard magnetic part and the first soft magnetic part; a second spin transfer intermediate part provided between the second hard magnetic part and the second soft magnetic part; and a controlling unit which passes a first writing current between the first hard magnetic part and the first soft magnetic part in correspondence with a combination of a first logic input signal and a second logic input signal to direct, a magnetization of the third ferromagnetic substance in a direction substantially parallel or anti-parallel to the first direction, the controlling unit reading a logic output based on a relative relation of the directions of magnetizations of the third and fourth ferromagnetic substances, by passing a sense current between the first and second soft magnetic parts.

According to other embodiment of the invention, there is provided a magnetic logic element comprising: a first hard magnetic part including a first ferromagnetic substance pinned in magnetization substantially in a first direction; a second hard magnetic part including a second ferromagnetic substance pinned in magnetization substantially in a second direction; a soft magnetic part provided between the first and the second hard magnetic pans, and having a third ferromagnetic substance; a spin transfer intermediate part provided between the first hard magnetic part and the soft magnetic part; a MR intermediate part provided between the second hard magnetic parts and the soft magnetic part; and a controlling unit which passes a first writing current between the first hard magnetic part and the soft magnetic part in correspondence with a combination of a first logic input signal and a second logic input signal to direct a magnetization of the third ferromagnetic substance in a direction substantially parallel or anti-parallel to the first direction, the controlling unit reading a logic output based on a relative relation of the directions of magnetizations of the second and the third ferromagnetic substances, by passing a sense current between the soft magnetic part and the second hard magnetic part.

According to other embodiment of the invention, there is provided a magnetic logic element comprising: a first hard magnetic part including a first ferromagnetic substance pinned in magnetization substantially in a first direction; a second hard magnetic part including a second ferromagnetic substance pinned in magnetization substantially in a second direction; a soft magnetic part provided between the first and the second hard magnetic parts, and having a third ferromagnetic substance; a spin transfer intermediate part provided between the first hard magnetic pa and the soft magnetic part; a MR intermediate part provided between the second hard magnetic parts and the soft magnetic part; and a controlling unit which applies a first voltage to one of the first hard magnetic part and the soft magnetic part in correspondence with a first logic input signal, and applies a second voltage to another of the first hard magnetic part and the soft magnetic part in correspondence with a second input signal, a writing generated by a difference between the first and the second voltages directing a magnetization of the third ferromagnetic substance in a direction substantially parallel or anti-parallel to the first direction, and the controlling unit reading a logic output based on a relative relation of the second direction and the direction of the magnetization of the third ferromagnetic substance, by passing a sense current between the soft magnetic part and the second hard magnetic part.

According to other embodiment of the invention, there is provided a magnetic logic element comprising: a hard magnetic part including a first ferromagnetic substance pinned in magnetization substantially in a first direction; a soft magnetic part including a second ferromagnetic substance; a MR intermediate part provided between the hard magnetic part and the soft magnetic part; a first writing wiring extending in a second direction; a second wiring extending in a direction other than the second direction; and a controlling unit which passes a first writing current to the first writing wiring in correspondence with a first logic input signal, and passes a second writing current to the second writing wiring in correspondence with a second logic input signal, a synthetic magnetic field formed by the first and second writing currents directing a magnetization of the second ferromagnetic substance in a direction substantially parallel or anti-parallel to the first direction, and the controlling unit reading a logic output based on a relative relation of the first direction and the direction of the magnetization of the second ferromagnetic substance, by passing a sense current between the soft magnetic part and the hard magnetic part.

According to other embodiment of the invention, there is provided a magnetic logic element array comprising: a plurality of magnetic logic element cells, each of the cell having; a first and second magnetic parts; and a MR intermediate part provided between the first and second magnetic parts; and a controlling unit that select specific one of the magnetic logic element cells and controls a relation of directions of magnetizations of the first and second magnetic parts of the specific one in accordance with a combination of a first binary input data and a second binary input data;, and reads a binary output data by detecting a magnetoresistance effect of the first and second magnetic parts through the MR intermediate part of the specific one.

According to other embodiment of the invention, there is provided a magnetic logic element array comprising: a plurality of magnetic logic element cells, each of the cells having, a first hard magnetic part including a first ferromagnetic substance pinned in magnetization substantially in a first direction; a second hard magnetic part including a second ferromagnetic substance pinned in magnetization substantially in a second direction; a MR intermediate part provided between the first and second hard magnetic parts; a first soft magnetic part provided between the first hard magnetic part and the MR intermediate part, and having a third ferromagnetic substance; a second soft magnetic part provided between the second hard magnetic part and the MR intermediate part, and having a fourth ferromagnetic substance; a first spin transfer intermediate part provided between the first hard magnetic part and the first soft magnetic part, and a second spin transfer intermediate part provided between the second hard magnetic part and the second soft magnetic part; and a controlling unit which selects a specific one of the magnetic logic element cells, the controlling unit passing a first writing current between the first hard magnetic part and the first soft magnetic part of the specific one in correspondence with a first logic input signal to direct a magnetization of the third ferromagnetic substance in a direction substantially parallel or anti-parallel to the first direction, the controlling unit passing a second writing current between the second hard magnetic part and the second soft magnetic part of the specific one in correspondence with a second logic input signal to direct a magnetization of the fourth ferromagnetic substance in a direction substantially parallel or anti-parallel to the second direction, and the controlling unit reading a logic output based on a relative relation of the directions of magnetizations of the third and fourth ferromagnetic substances, by passing a sense current between the first and second soft magnetic parts of the specific one.

According to the embodiment of the invention, a magnetic logic element which has a logic processing function as well as a memory function with a reduced size, and the magnetic logic element array can be realized. As the result, small, high-density, and low power consuming logic devices and/or memory devices can be realized, and a merit on industry is great.

BRIEF DESCRIPTION OF THE DRAWINGS

The present invention will be understood more fully from the detailed description given herebelow and from the accompanying drawings of the embodiments of the invention. However, the drawings are not intended to imply limitation of the invention to a specific embodiment, but are for explanation and understanding only.

In the drawings:

FIGS. 13A and 13B show the example which performs negative logical sum (NOR) processing using the magnetic logic element of the embodiment;

FIGS. 13C and 13D show the example which performs logical sum (OR) processing using the magnetic logic element of the embodiment;

FIGS. 17A through 17D are conceptual diagrams explaining the logic processing in the magnetic logic element according to this example;

FIGS. 17E and 17F show the example where negative logical sum (NOR) processing is performed;

FIGS. 17G and 17H show the example where a logical sum (OR) processing is performed;

FIGS. 18A through 18D are diagrams showing the example where exclusive OR (EOR) processing is performed using the magnetic logic element of this embodiment, where FIGS. 18B and 18D are the truth tables for the first and second cells;

FIGS. 19A through 19D show the example where negative exclusive OR (NEOR) processing is performed;

FIG. 21A shows the plane view, and FIG. 21B shows the elevational view;

FIGS. 23A through 23D show such a combination of two cells;

DETAILED DESCRIPTION

Figure 1:
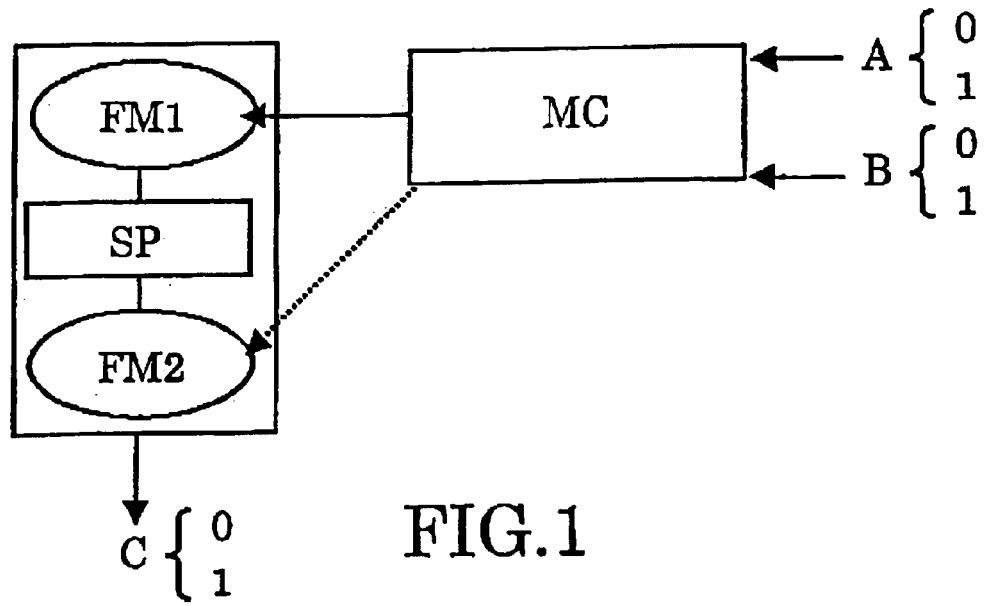
FIG. 1 is a schematic diagram which expresses operation of the first magnetic logic element of the embodiment.

Hereafter, some embodiment of the invention will be explained, referring to the drawings.

FIG. 1 is a schematic diagram which expresses operation of the first magnetic logic element of the invention. That is, this magnetic logic element is provided with two magnetic parts (FM1, FM2), MR intermediate part (SP) and the magnetization direction control part (MC). MR intermediate part (SP) is provided between two magnetic parts (FM1, FM2). The magnetization direction control part (MC) controls the magnetization direction of at least one of these magnetic parts (FM1, FM2). And "0" and "1" are assigned to the input signal A and input signal B for controlling the magnetization directions of the magnetic parts (FM1, FM2), respectively.

The combination of the incoming signals A and B determines magnetizations of the magnetic parts (FM1, FM2), and a signal reflecting the magnetoresistance effect through the MR intermediate part SP is output as an output signal C.

Figure 2:
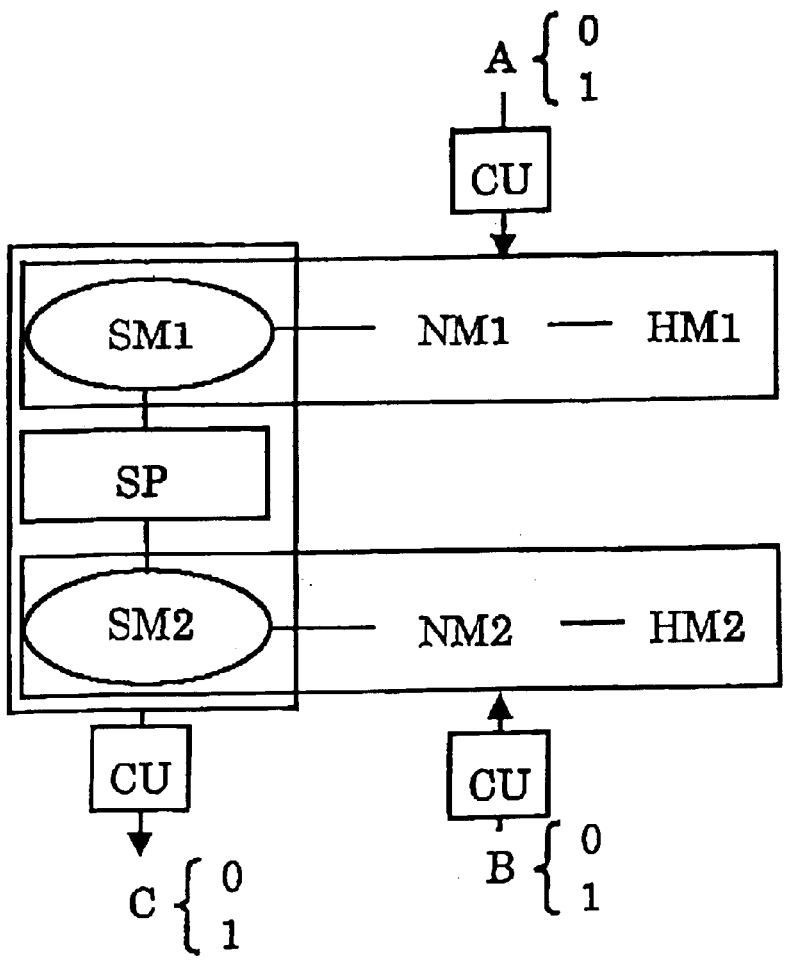
FIG. 2 is a schematic diagram which explains the operation of the second magnetic logic element of the embodiment.

Next, FIG. 2 is a schematic diagram which explains the operation of the second magnetic logic element of the invention. This magnetic logic element is provided with a first hard magnetic part (HM1) containing the first ferromagnetic substance whose magnetization direction fixed in the first direction, and a second hard magnetic part (HM2) containing the second ferromagnetic substance whose magnetization direction fixed in the second direction. Furthermore, the MR intermediate part (SP), the first soft magnetic part (SM1), the second soft magnetic part (SM2) are prepared. MR intermediate part (SP) is prepared between these soft magnetic parts (SM1, SM2).

The first soft magnetic part (SM1) is prepared between the first hard magnetic part (HM1) and the MR intermediate part (SP), and has the third ferromagnetic substance. The second soft magnetic part (SM2) is provided between the second hard magnetic part (HM2) and the MR intermediate part (SP), and has the fourth ferromagnetic substance.

Furthermore, the element has the first spin transfer intermediate part (NM1) provided between the first hard magnetic part (HM1) and the first soft magnetic part (SM1), and the second spin transfer intermediate part (NM2) provided between the second hard magnetic part (HM2) and the second soft magnetic part (SM2).

By passing a writing current, via the controlling unit (CU), between the first hard magnetic part (HM1) and the first soft magnetic part (SM1) in correspondence with the first logic input signal A, the magnetization of the third ferromagnetic substance of the first soft magnetic part (SM1) is directed in a direction substantially parallel or anti-parallel to the first direction.

And, by passing a writing current, via the controlling unit (CU), between the second hard magnetic part (HM2) and the second soft magnetic part (SM2) in correspondence with the second logic input signal B, the magnetization of the fourth ferromagnetic substance of the second soft magnetic part (SM2) is directed in a direction substantially parallel or anti-parallel to the second direction.

On the other hand, the logic output C based on the relative relation of the directions of magnetizations of the third and fourth ferromagnetic substances can be obtained from the controlling unit (CU), by passing a sense current between the first and second soft magnetic parts (SM1, SM2).

Figure 3:
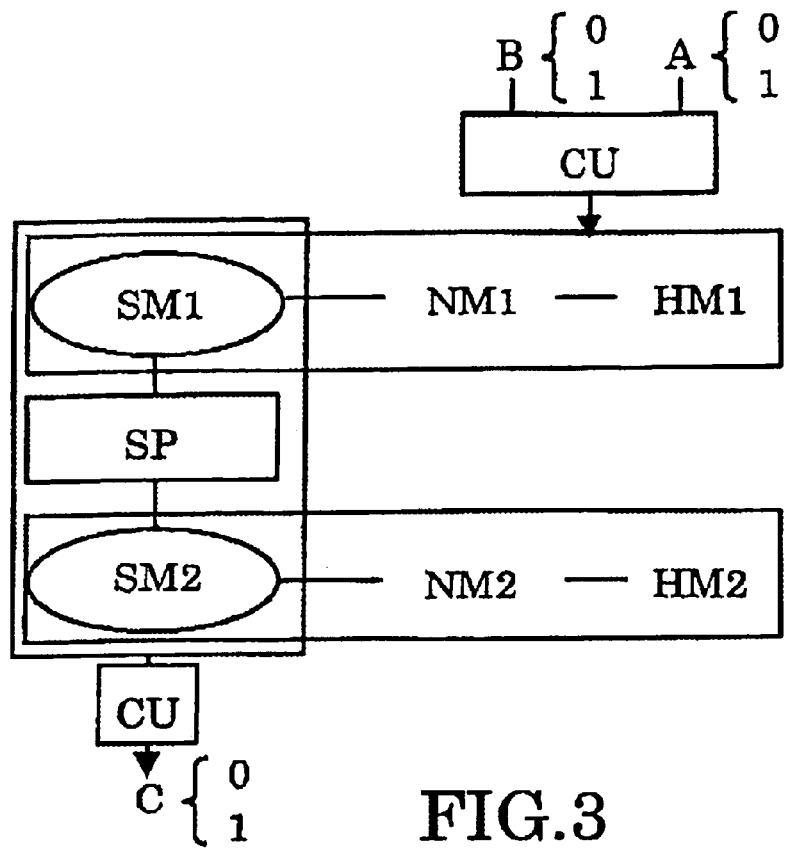
FIG. 3 is a schematic diagram which explains the operation of the third magnetic logic element of the embodiment.

Next, FIG. 3 is a schematic diagram which explains the operation of the third magnetic logic element of the invention. This magnetic logic element is also provided with the first hard magnetic part (HM1) containing a first ferromagnetic substance where the magnetization direction if fixed in a first direction, and the second hard magnetic part (HM2) containing a second ferromagnetic substance where the magnetization direction fixed in a second direction. Furthermore, MR intermediate part (SP), the first soft magnetic part (SM1), and the second soft magnetic part (SM2) are provided. The MR intermediate part (SP) is provided between the hard magnetic parts (HM1, HM2).

The first soft magnetic part (SM1) is provided between the first hard magnetic part (HM1) and the MR intermediate part (SP), and has a third ferromagnetic substance. The second soft magnetic part (SM2) is provided between the second hard magnetic part (HM2) and the MR intermediate part (SP), and has a fourth ferromagnetic substance.

This element further has a first spin transfer intermediate part (NM1) provided between the first hard magnetic part (HM1) and the first soft magnetic part (SM1), and the second spin transfer intermediate part (NM2) provided between the second hard magnetic part (HM2) and the second soft magnetic part (SM2).

By passing a writing current, via the controlling unit (CU), between the first hard magnetic part (HM1) and the first soft magnetic part (SM1) in correspondence with a combination of the first logic input signal A and the second logic input signal B, the magnetization of the third ferromagnetic substance of the first soft magnetic part (SM1) is directed in a direction substantially parallel or anti-parallel to the first direction.

On the other hand, the logic output C based on the relative relation of the directions of magnetizations of the third and fourth ferromagnetic substances can be obtained from the controlling unit (CU), by passing a sense current between the first and second soft magnetic parts (SM1, SM2).

Figure 4:
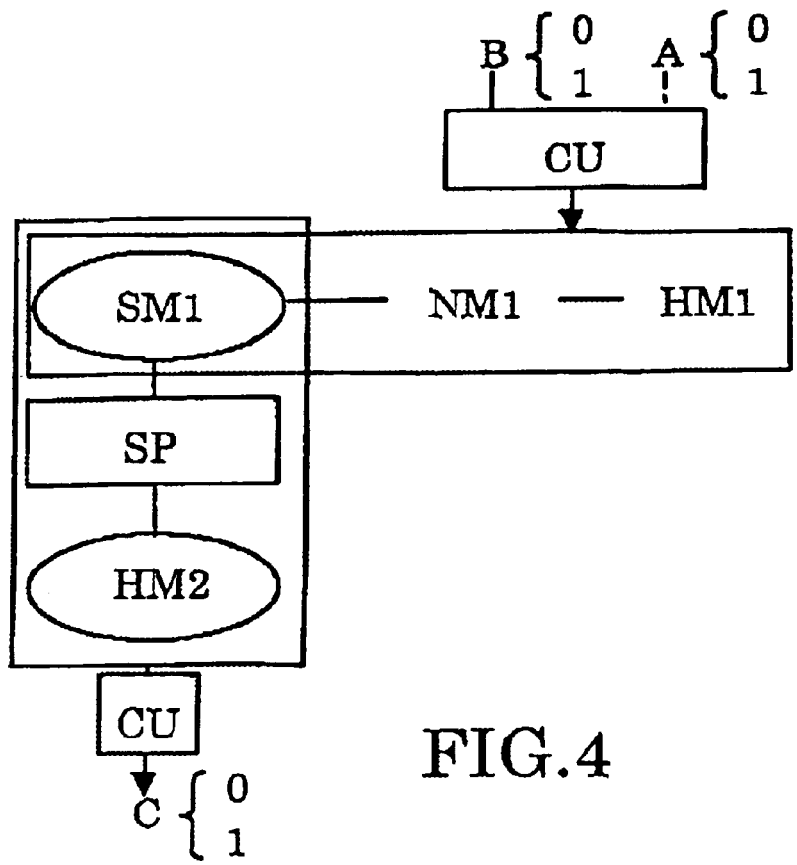
FIG. 4 is a schematic diagram which explains operation of the fourth magnetic logic element of the embodiment.

Next, FIG. 4 is a schematic diagram which explains operation of the fourth magnetic logic element of the invention. This magnetic logic element is provided with a first hard magnetic part (HM1), a second hard magnetic part (HM2), a soft magnetic part (SM1), a spin transfer intermediate part (NM1), and a MR intermediate part (SP).

The first hard magnetic part (HM1) contains a first ferromagnetic substance whose magnetization direction is fixed in a first direction. The second hard magnetic part (HM2) contains a second ferromagnetic substance whose magnetization direction is fixed in a second direction. A soft magnetic part (SM1) is provided between the first and second hard magnetic parts, and contains a third ferromagnetic substance. The spin transfer intermediate part (NM1) is provided between the first hard magnetic part (HM1) and the soft magnetic part (SM1). MR intermediate part (SP) is provided between the second hard magnetic part (HM2) and the soft magnetic part (SM1).

By passing a writing current, via the controlling unit (CU), between the first hard magnetic part (HM1) and the first soft magnetic part (SM1) in correspondence with a combination of the first logic input signal A and the second logic input signal B, the magnetization of the third ferromagnetic substance of the soft magnetic part (SM1) is directed in a direction substantially parallel or anti-parallel to the first direction.

The logic output C based on the relative relation of the directions of magnetizations of the second and third ferromagnetic substances can be obtained from the controlling unit (CU), by passing a sense current between the second hard magnetic part (HM2) and the soft magnetic part (SM1). Hereafter, the structures of still more concrete elements will be explained.

(First Embodiment)

Figure 5A:
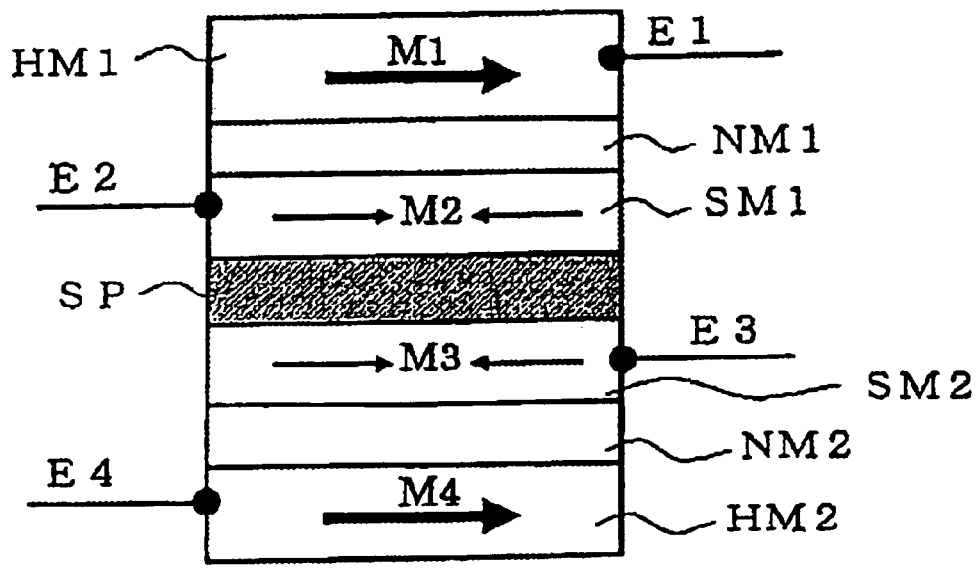
FIGS. 5A and 5B are schematic diagrams which illustrate the principal part sectional structure of the magnetic logic element according to the first embodiment of the invention.
Figure 5B:
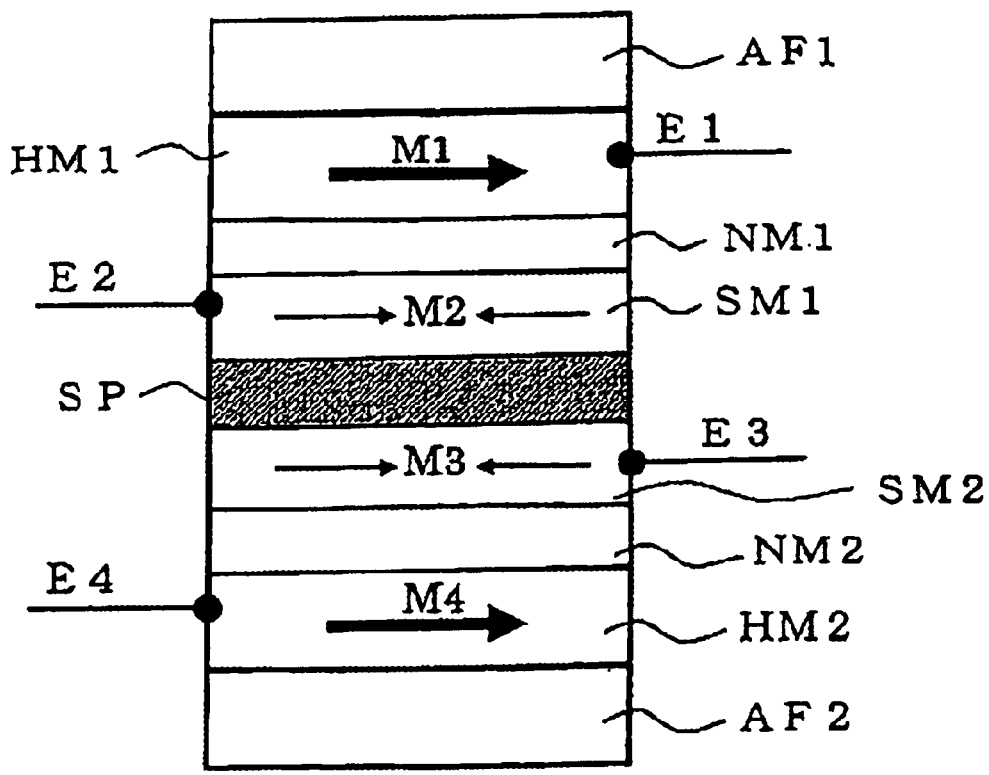

FIGS. 5A and 5B are schematic diagrams which illustrate the principal part sectional structure of the magnetic logic element according to the first embodiment of the invention.

That is, the magnetic logic element of this embodiment has a MR intermediate part SP and soft magnetic parts SM1 and SM2 provided at its both sides, respectively.

Furthermore, hard magnetic parts HM1 and HM2 are provided in the outside through the spin transfer intermediate parts NM1 and NM2, respectively. Moreover, electrodes E1, E2, E3 and E4 are provided on to the hard magnetic parts HM1 and HM2 and soft magnetic pans SM1 and SM2, respectively.

Here, "soft magnetic part" is a part where magnetization is not fixed but in a free state so that the direction thereof is changeable. And, "hard magnetic part" is a part which consists of material with a large coercive force, or whose magnetization is fixed. Therefore, there may be a case where the materials of the soft magnetic part and the hard magnetic part are the same. The magnetization of the hard magnetic parts HM1 and HM2 are fixed to be in parallel or anti-parallel. As will be explained later, the magnetization of the hard magnetic parts (HM1, HM2) can be fixed by providing anti-ferromagnetic layers (AF1, AF2) to adjoin these hard magnetic parts (HM1, HM2), as shown in FIG. 5B.

Here, input signals A and B are suitably inputted into electrodes E1–E4. The direction of magnetization M2 of the soft magnetic part SM1 is controlled by inputting an input signal into the electrodes E1 and E2. The direction of the soft magnetic part SM2 is controlled by inputting an input signal into the electrodes E3 and E4.

In any of these cases, the magnetization directions of soft magnetic parts SM1 and SM2 are controlled by a spin-polarized electron current.

Figure 6A:
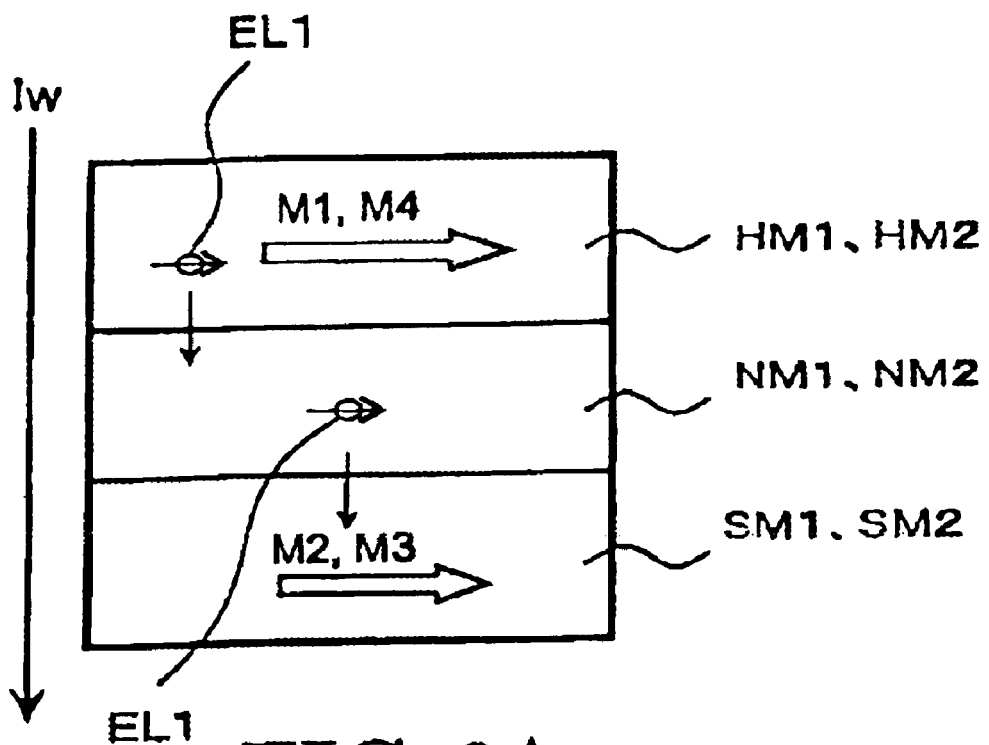
FIGS. 6A and 6B are schematic diagrams to explain the controlling mechanism of magnetization by using a spin-polarized current.
Figure 6B:
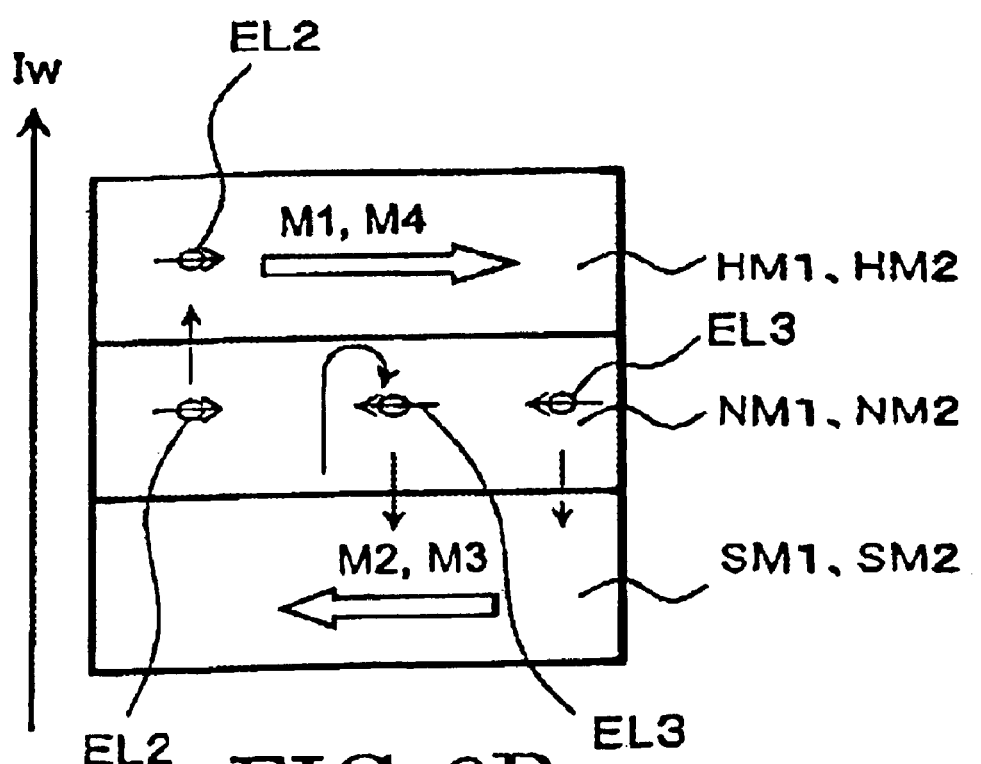

FIGS. 6A and 6B are schematic diagrams to explain the controlling mechanism of magnetization by using a spin-polarized current.

If a electronic current Iw is passed towards the soft magnetic part SM1 (or SM2) from the hard magnetic part HM1 (or HM2), as shown in FIG. 6A, writing to the soft magnetic part SM1 (or SM2) is carried out according to the direction of the magnetization M1 (or M4) of the hard magnetic part HM1 (or HM2). That is, when the electronic current Iw is passed in this direction, in a hard magnetic part HM1 (or HM2), a polarization of the electronic spin is first carried out according to the direction of the magnetization M1 (or M4). These spin-polarized electrons EL1 flow into the soft magnetic part SM1 (or SM2), and reverse the magnetization M2 into a direction of the magnetization M1 (or M4) of the hard magnetic part HM1 (or HM2).

On the other hand, if electron current is passed towards the hard magnetic part HM1 (or HM2) from the soft magnetic part SM1 (or SM2) as expressed in FIG. 6B, write-in in an opposite direction can be performed. That is, electrons EL2 which have a spin corresponding to the magnetization M1 (or M4) of a hard magnetic part HM1 (or HM2) can pass the hard magnetic part HM1 (or HM2) easily. However, electrons EL3 which have a spin opposite to the magnetization M1 (M4) are reflected at the interface between the spin transfer intermediate part NM1 (or NM2) and the hard magnetic part NM1 (or NM2) by a high probability. And when the spin-polarized electron reflected in this way returns to the soft magnetism part SM1 (or SM2), the magnetization M2 (or M3) of the soft magnetic part SM1 (or SM2) is reversed in the direction contrary to the hard magnetic part M1 (or M4).

Such "direct-current-driving magnetization reversal" is disclosed by, for example, J. C. Slonczewski, J. Magn. Magn. Mater. 159, L1 (1996), E. B. Myers, et al., Science 285, 867(1999), J. A. Katine, et al., Phys. Rev. Lett., 14, 3149 (2000), F. J. Albert, et al., Appl. Phy. Lett., 77, 3809 (2000), J. E. Wegrowe, et al., Europhys. Lett., 45, 626 (1999), and J. Z. Sun, J. Magn. Magn. Mater., 202, 157 (1999).

In this mechanism, when a writing current is passed through or reflected from the hard magnetic part HM1 (or HM2), the spin of the current is polarized. When this spin-polarized current passes through the soft magnetic part, magnetization of the soft magnetic part is reversed by transmitting the anglar momentum of the spin-polarized electron to the anglar momentum of the soft magnetic part.

Thus, in the embodiment, a desired magnetization can be written in the soft magnetic part SM1 (or SM2) according to the magnetization reversal mechanism of a direct-current-driving type realized by a spin-polarized current. That is, it is possible to make a more direct driving to a soft recording layer. Therefore, as compared with the conventional recording element which carries out magnetization reversal of the recording layer by a magnetic field generated by the current, it becomes possible to decrease current required for magnetization reversal at the time of recording.

On the other hand, in the magnetic logic element of FIG. 5, read-out of information, i.e., the output of a logic signal, can be performed by reading the magnetoresistance between the electrodes E2 and E3.

Figure 7A:
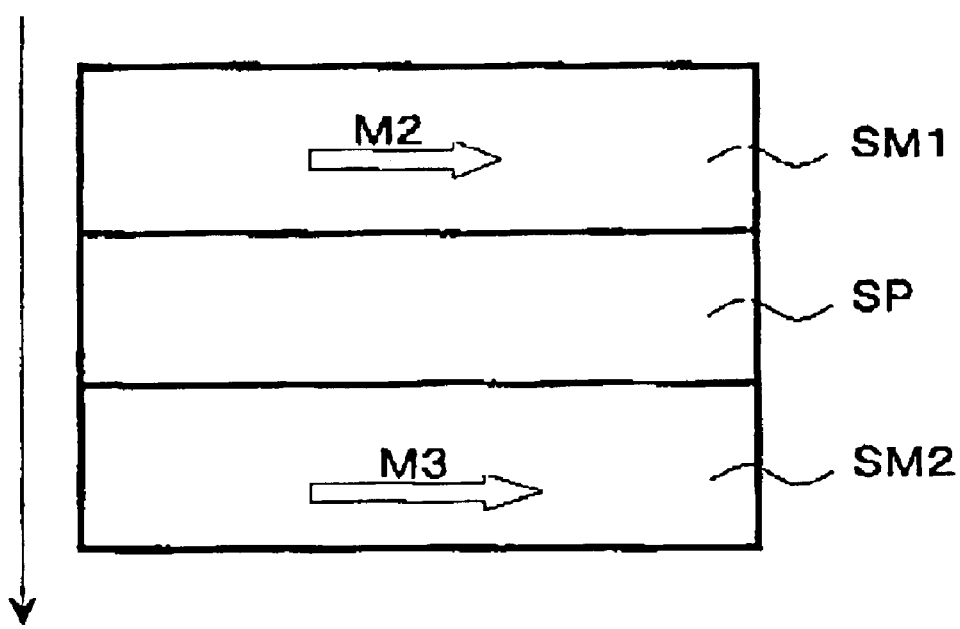
FIGS. 7A and 7B are schematic diagrams explaining operation of read-out of the information in the magnetic logic element of the embodiment.
Figure 7B:
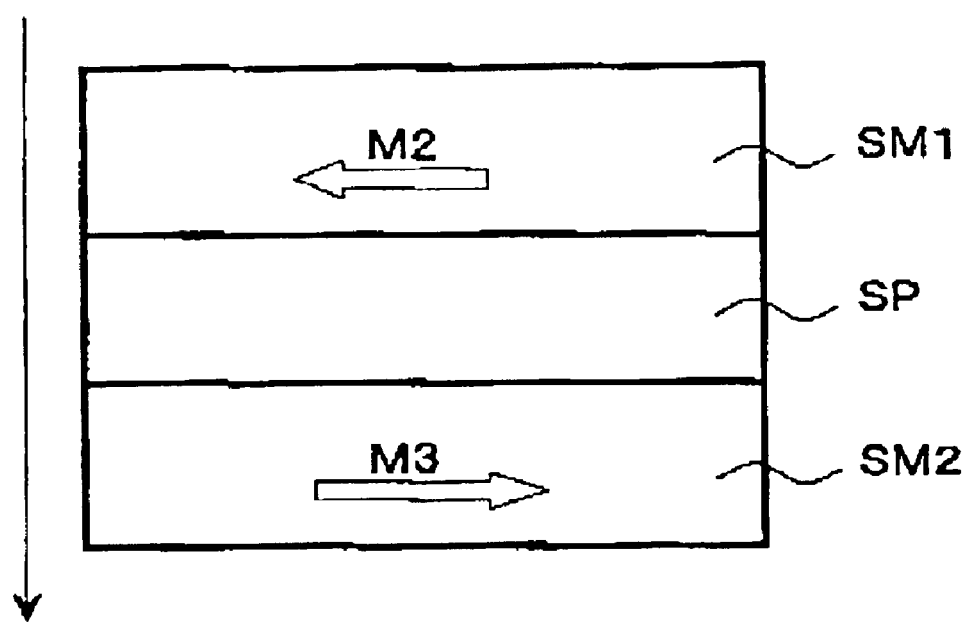

FIGS. 7A and 7B are schematic diagrams explaining operation of read-out of the information in the magnetic logic element of this embodiment.

That is, as expressed in FIG. 7A, when the magnetization M2 of the soft magnetic part SM1 and the magnetization M3 of soft magnetic part SM2 are parallel, the resistance obtained by passing a sense current is in the direction expressed with the arrow (or a direction contrary to this) is low.

On the other hand, the resistance becomes high when the magnetization M2 of the soft magnetic part SM1 and the magnetization M3 of the soft magnetic part SM2 arc anti-parallel, as expressed in FIG. 7B. Therefore, corresponding to these resistance output, read-out of a binary information can be performed by assigning "0" level and "1" level, respectively. For example, the state where resistance is low can be set to "0", and the state where resistance is high can be set to "1". They may be assigned contrary.

According to the embodiment, it becomes possible to perform various kinds of logic processing, by selecting the combination of the signal inputted into electrodes E1–E4, respectively, as will be explained in full detail later.

In the embodiment, it becomes possible to read binary information corresponding to the magnetization direction of the soft magnetic parts SM1 and SM2 by high sensitivity by using a magnetoresistance effect. Furthermore, resistance of the reproduction part which passes sense current is can be made high to the optimal level by devising the material and structure of the MR intermediate part SP suitably, as will be explained in full detail later. As that result, element selection in a case where the elements are arranged in an array becomes easy, and thus, a memory device or a logic circuit etc. can be realized.

In the embodiment, the spin transfer intermediate parts NM1 and NM2 can be formed by the material of low resistance. Therefore, when detecting the magnetoresistance effect between soft magnetic parts SM1 and SM2, the sense current Is may be passed between the electrode E1 and the electrode E4.

As the materials of the hard magnetic parts HM1, HM2 and the soft magnetic parts SM1, SM2, magnetic materials such as an element among iron (Fe), cobalt (Co), and nickel (Ni), etc. can be used. Alternatively an alloy containing at least one element among iron (Fe), cobalt (Co), nickel (Ni), manganese (Mn) and chromium (Cr) can be used. Furthermore, a NiFe-family alloy called "Permalloy" can be used. Furthermore, a soft magnetic material such as a CoNbZr-family alloy, a FeTaC-family alloy, a CoTaZr-family alloy, a FeAlSi-family alloy, a FeB-family alloy, a CoFeB-family alloy, or the like can be used. Furthermore, a half-metal magnetic material such as a $CrO_2$, $Fe_3O_4$, or $La_{1-x}Sr_xMnO_3$ can be used. Further, a Heusler alloy can be used.

Alternatively, the magnetic parts HM1, HM2, SM1 and SM2 can be made of a compound semiconductor or oxide semiconductor containing at least one magnetic element among iron (Fe), cobalt (Co), nickel (Ni), manganese (Mn) and chromium (Cr), such as (Ga, Cr)N, (Ga, Mn)N, MnAs, CrAs, (Ga, Cr)As, ZnO:Fe, (Mg, Fe).

Any of these materials can be suitably selected and used by taking their magnetic properties and other relevant characteristics.

As a material used for these magnetic parts, a continuous magnetic body may be used. Alternatively, a composite structure where particles which consist of the magnetic body are precipitated or formed in a non-magnetic matrix can also be used. As the soft magnetic part SM1, SM2, two-layered structure which consists of (Co or CoFe alloy)/(a permalloy which consists of NiFe or NiFeCo, or nickel), or three-layered structure which consists of (Co or CoFe alloy)/(permalloy which consists of NiFe or NiFeCo, or nickel)/(Co or CoFe alloy) can also be used especially.

As for the thickness of the outside Co or a CoFe alloy layers in these multi-layered structure, it is desirable to set in a range of 0.2 nm to 3 nm.

Furthermore, as the soft magnetic part SM1, SM2, and the hard magnetic part HM1, HM2, a three-layered structure which consists of (magnetic layers, such as a permalloy, Co, Co—Fe)/(non-magnetic layers, such as Cu and Ru (between 0.2 nm and 3 nm in thickness))/(magnetic layers, such as a permalloy, Co, Co—Fe) having an exchange-coupling between the layers can also be used. When this three-layered structure is used, the switching current and the switching magnetic field can be made even smaller, because a magnetization field and stray field can be reduced. Furthermore, by using three-layered structure to HM1, HM2, the magnetization direction of M1, M4 can be controlled by changing the nonmagnetic layer thickness.

On the other hand, in order to fix the magnetization M1, M4 of the hard magnetic part HM1, HM2, it is effective to provide anti-ferromagnetic layers (not shown) adjoining the hard magnetic parts HM1, HM2, respectively, and to apply exchange bias to them. By providing such anti-ferromagnetic layers, exchange bias can be applied effectively to control the magnetization M1, M4, and a large signal output of the magnetoresistance effect can be obtained. For this purpose, it is desirable to use anti-ferromagnetic material such as iron manganese (FeMn), platinum manganese (PtMn), palladium manganese (PdMn), palladium platinum manganese (PdPtMn), etc.

Here, although cross-sectional structure is shown in FIG. 5, as for the plane form of each magnetic part, it is desirable to set it into a rectangular or elongated hexagonal shapes. That is, as for a magnetic part, it is desirable to have an aspect ratio between about 1:1.1 to 1:5, and to have a uniaxial magnetic anisotropy. Moreover, the longitudinal lengths of each magnetic part are preferably in a range between 5 nm and 1000 nm.

As for the material of the MR intermediate layer SP, it is desirable to use a nonmagnetic metal or the insulator which consists of any of oxide, nitride fluoride including at least one element chosen from the group consisting of aluminum (Al), titanium (Ti), tantalum (Ta), cobalt (Co), nickel (nickel), silicon (Si), and iron (Fe).

The spin transfer intermediate parts NM1 and NM2 have a role to suppress the magnetic coupling between the soft magnetic part and the hard magnetic part, and acts as a passage of the spin-polarized electrons, These intermediate parts NM1 and NM2 can be formed by the following material.

(1) a metal consisting of a non-magnetic noble-metals element such as Cu, Ag, and Au, or a metal which includes at least one of these elements.

(2) a material which consists of the same magnetic element as the soft magnetic part SM and/or hard magnetic part HM, and further having a portion including crystal defects, or surface unevenness so that magnetic domains are trapped.

The above-mentioned crystal defects can be introduced by an electron irradiation or an ion irradiation. The surface unevenness can be formed by a providing a constriction on a thin line, for example.

As for the thickness of the hard magnetic part, it is desirable to make it in the range of 0.6 nm–100 nm. As for the thickness of a soft magnetic part, it is desirable to make it in the range of 0.2 nm–50 nm. Moreover, as for the thickness of a spin transfer intermediate part, it is desirable to make it in the range of 0.2 nm–100 nm. Furthermore, as for the thickness of MR intermediate part, it is desirable to make it in the range of 0.2 nm–10 nm. Fabrication of the element will become easier if the magnetic parts HM and SM and the MR intermediate part SP are made into the shape of a thin film, or the form of a thin line.

FIGS. 8A through 8D are schematic sectional views showing the examples of transformation of the magnetic logic element of this embodiment. The same symbols are given to the similar elements as what was mentioned above about FIGS. 1 through 7B about these figures, and detailed explanation will be omitted.

In each example of the transformation, a point contact i.e. magnetic nanocontact P whose contact area is 100 nm2 or less is provided in the MR intermediate part SP. In this magnetic nanocontact P, at least one of the soft magnetic parts SM1 and SM2 extends into the intermediate part SP and they are connected each other. And in the MR intermediate part SP, the circumference of the nanocontact P is covered by the insulator.

Figure 8A:
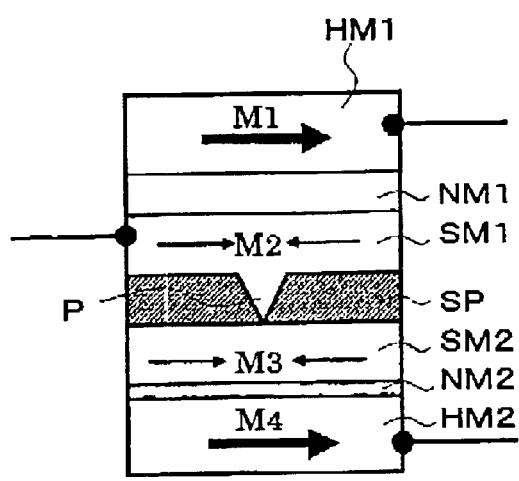
FIGS. 8A through 8D are schematic sectional views showing the examples of transformation of the magnetic logic element of the embodiment.
Figure 8C:
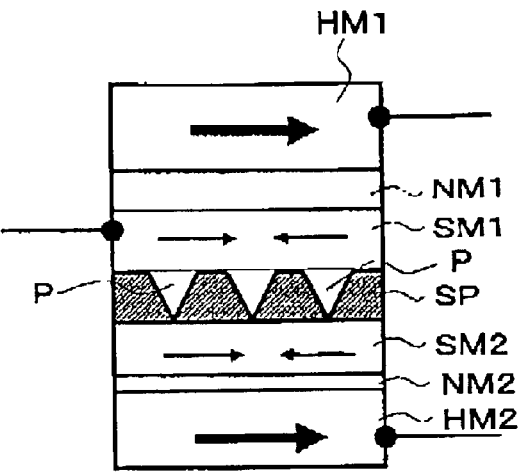
Figure 8B:
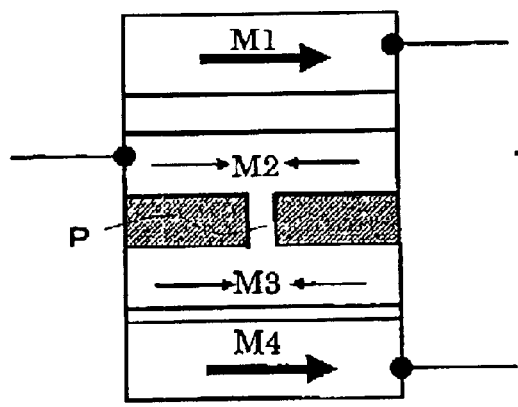
Figure 8D:
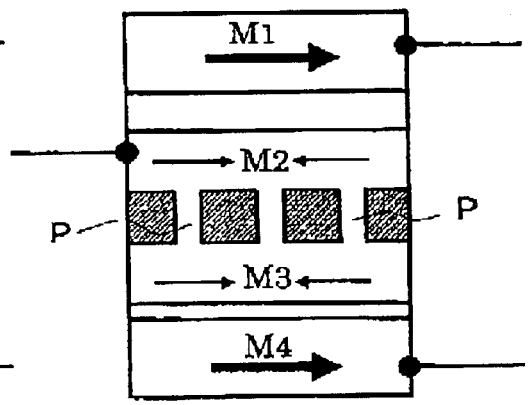

This magnetic nanocontact P may have the cone-like section, as illustrated in FIG. 8A, or as illustrated in FIG. 8B, it may have the pillar-like section. Furthermore, as illustrated in FIGS. 8C and 8D, two or more magnetic nanocontacts P may be provided.

When such a magnetic nanocontact P is miniaturized, resistance will decrease by applying a magnetic field. The size at which reduction of such resistance is produced may depend on the cross-sectional form of the nanocontact P. However, according to the result of examination of the Inventors, when the minimum width of the nanocontact P is set to 20 nm or less, the reduction in resistance becomes remarkable. A large magnetoresistance effect that a magnetoresistance rate of change becomes 20% or more can be obtained at this time. However, when the cross-sectional form of the nanocontact P is extremely elongate, for example, reduction of the resistance by application of a magnetic field may arise, even if the maximum width exceeds 20 nm. The magnetic logic elements which have such a magnetic nanocontact P are also included in the range of the invention.

By providing such a magnetic nanocontact P, the magnetoresistance effect obtained between soft magnetic parts SM1 and SM2 improves. As a result, it becomes possible to read the relative relation between the directions of magnetizations M2 and M4 of soft magnetic parts SM1 and SM2 with very high sensitivity.

When providing such a magnetic nanocontact P, in the MR intermediate part SP, the material around the nanocontact P may be formed by an insulating material, and thickness of the MR intermediate part SP may be formed into a thick film in the range of about 0.2 nm–1000 nm.

Figure 9A:
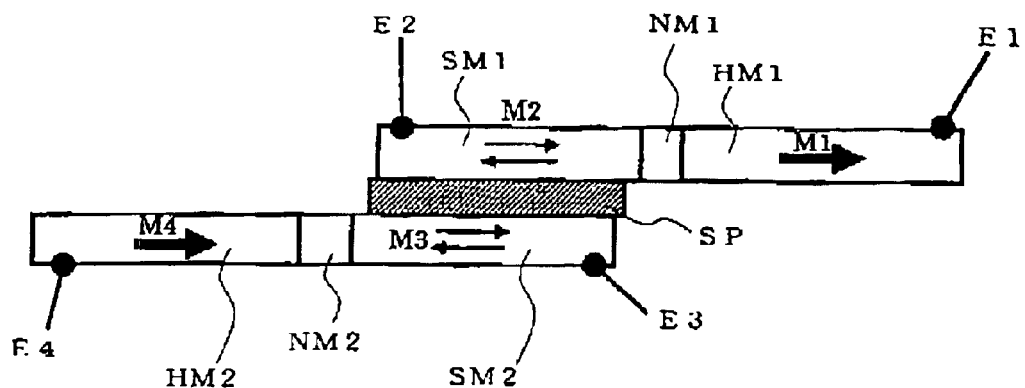
FIGS. 9A and 9B are schematic sectional views showing other examples of transformation of the magnetic logic element of the embodiment.
Figure 9B:
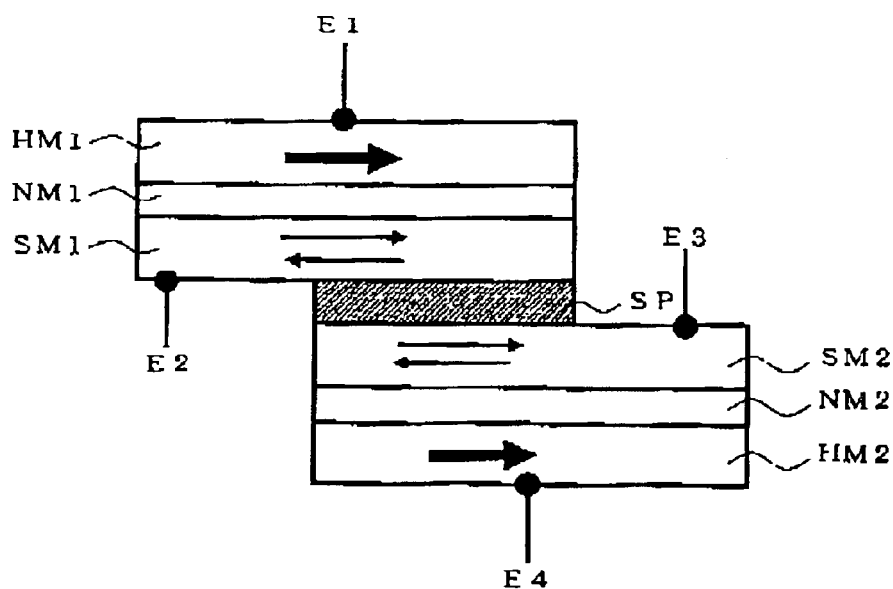

FIGS. 9A and 9B are schematic sectional views showing other examples of transformation of the magnetic logic element of this embodiment. The same symbols are given to the similar elements as what was mentioned above about FIGS. 1 through 8D about this figure, and detailed explanation will be omitted.

Also in this example, soft magnetic parts SM1 and SM2 are laminated on the upper and lower sides of the MR intermediate part SP, respectively. However, in the structure shown in FIG. 9A, the spin transfer intermediate parts NM1 and NM2 provided on upper and lower sides and the hard magnetic parts HM1 and HM2 provided in the top and bottom arc adjoined and provided in the lateral direction, respectively. That is, the spin transfer intermediate parts NM1 and NM2 and the hard magnetism parts HM1 and HM2 are not laminated in the direction of thickness, but adjoin in the direction of the film plane of the soft magnetic parts SM1 and SM2, respectively.

In contrast, in the structure shown in FIG. 9B, each of the upper and lower parts is laminated. Such a structure is also employable in the invention.

Even if each part of the magnetic logic element is arranged in such a fashion, the input operation by the spin-polarized current as mentioned above with reference to FIGS. 6A and 6B, and the output operation by the magnetoresistance effect as mentioned above with reference to FIGS. 7A and 7D can be performed.

In the case of this modification, the plane form of the soft magnetic parts may be the one whose aspect ratio in the range of about 1:1.1 to 1:20.

Moreover, although the MR intermediate part SP may be formed as a single insulating layer, the effect mentioned above with reference to FIGS. 8A through 8D can be similarly acquired by providing a magnetic nanocontact P.

Now, the magnetic logic element of this embodiment explained referring to FIGS. 1 through 9 can be used as a logic element which performs various kinds of logical operations.

Figures 10A, 10B, 10C:
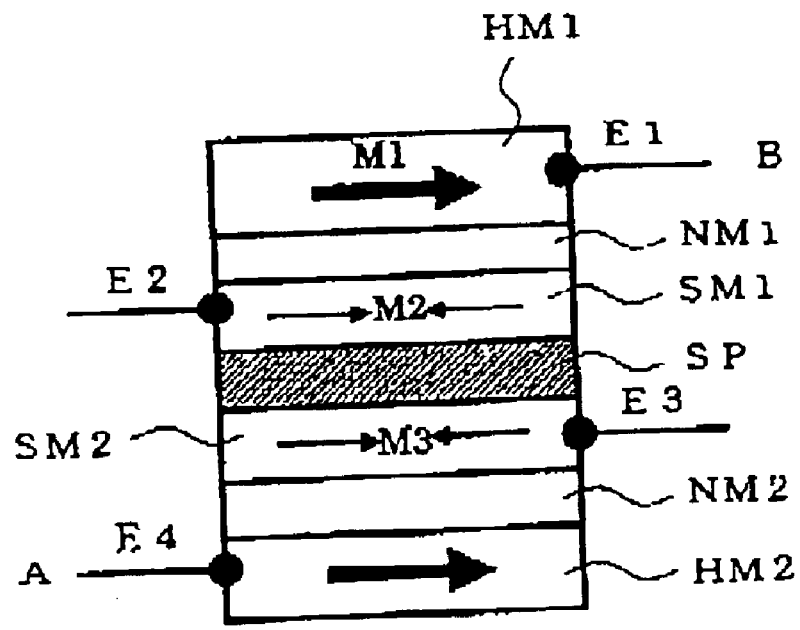
FIGS. 10A through 10C show operation in the case of performing exclusive OR (EOR) using the magnetic logic element of the embodiment.

FIGS. 10A through 10C show operation in the case of performing exclusive OR (EOR) using the magnetic logic element of this embodiment. Here, as exemplified in FIG. 10A, a predetermined voltage corresponding to signal B is inputted into the electrode E1, and a predetermined voltage corresponding to signal A is inputted into the electrode E4. However, signal A and signal B can be made reverse, and the voltage can also be inputted into the electrode E2 or E3 instead of E1 or E4.

If the signal is inputted as shown in FIG. 10A, the potential of the electrodes E2 and E3 is set to a certain voltage of, for example, 0 volt and = volt, where α includes zero, respectively. When signal A or signal B is "0", the negative predetermined voltage with respect to the potentials of E2 and E3 corresponding to this is applied to electrodes E1 and E4, respectively. Moreover, when Signal A or Signal B is "1", the positive predetermined voltage with respect to the potential of E2 and E3 corresponding to this is applied to electrodes E1 and E4, respectively.

This "predetermined voltage" is set up so that it may produce current beyond the critical current Ic which causes magnetization switching of soft magnetic parts SM1 and SM2. That is, the voltage which can give a spin-polarized current required for magnetization reversal of soft magnetic parts SM1 and SM2 is the "predetermined voltage."

When Signal A is "0", the direction of the magnetization M2 of soft magnetic part SM turns into the same direction as the magnetization M1 of a hard magnetic part HM1, i.e., in the right direction. When Signal A is "1", the direction of the magnetization M2 of soft magnetic part SM turns into the opposite direction to the magnetization M1, i.e., in the left direction.

Similarly, the magnetization M3 of soft magnetic part SM2 is in the rightward, when signal B is "0", and is in the leftward when signal B is "1."

The output signal from this magnetic logic element is determined by the relative relation between the direction of the magnetization M2 of soft magnetic part SM1, and the direction of the magnetization M3 of soft magnetic pan SM2.

FIG. 10B is a table showing the magnetization arrangement relation of soft magnetic parts SM1 and SM2 obtained according to the combination of the input signals. In the figure, the upper arrow of each column shows the directions of the magnetization M2 of the soft magnetic part SM1, and a lower arrow shows the direction of the magnetization M3 of the soft magnetic part SM2, respectively.

FIG. 10C shows the output signals acquired by the magnetoresistance effect corresponding to the magnetization arrangement relations of FIG. 10B. High resistance state which corresponds to the anti-parallel alignment of 10B is assigned to be "0" or "1", and low resistance state which corresponds to the anti-parallel alignment of 10B is assigned to be "1" or "0". When the potential of electrodes E2 and E3 are different, the potential difference generates sense current, therefore the output signals are acquired simultaneously with inputting signals.

From FIG. 10C, it is understood that the each output signal acquired from each combination of the binary input signals A and B is the exclusive OR thereof. That is, exclusive OR (EOR) processing is possible by this magnetic logic element.

Furthermore, negative exclusive OR (NEOR) can also be obtained by reversing and inputting one of signal A or signal B to the magnetic logic element of this example.

Figures 11A, 11B, 12A, 12B, 12C, 12D:
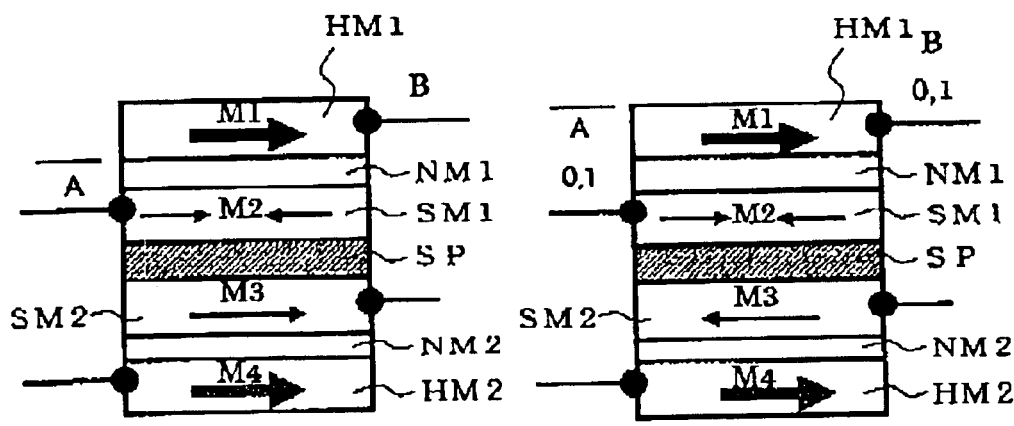
FIG. 11A is a figure showing the magnetization arrangement relations of the soft magnetic parts SM1 and SM2 when the input of signal B is reversed.
FIG. 11B is a figure showing the output signals acquired from these magnetization arrangements by the magnetoresistance effect.
FIGS. 12A and 12B show the example which performs logical product (AND) processing using the magnetic logic element of the example.
FIGS. 12C and 12D show the example which performs negative logical product (NAND) processing using the magnetic logic element of this example.

FIG. 11A is a figure showing the magnetization arrangement relations of the soft magnetic parts SM1 and SM2 when the input of signal B is reversed. That is, in the case of this example, when signal B is "0", a positive predetermined voltage with respect to the potential of E2 corresponding to this is applied to the electrode E1, and when signal B is "1", the negative predetermined voltage with respect to the potential of E2 corresponding to this is applied to the electrode E1.

FIG. 11B is a figure showing the output signals acquired from these magnetization arrangements by the magnetoresistance effect. As this result also shows, it turns out that negative exclusive OR (NEOR) is performed to the input signals A and B.

FIGS. 12A and 12B show the example which performs logical product (AND) processing using the magnetic logic element of this example.

FIGS. 12C and 12D show the example which performs negative logical product (NAND) processing using the magnetic logic element of this example.

In any of these cases, signal A and signal B are inputted into the electrodes E2 and E1, respectively. However, signal A is reversed. When the inputted signal is "0", the lower predetermined voltage is applied, and when the inputted signal is "1", the higher predetermined voltage is applied (or vice versa).

Moreover, in the case of a logical product (AND) processing, the magnetization direction of soft magnetic part SM2 is parallel to the magnetic direction of HM1, that is, the rightward in the case of FIG. 12A, while in the case of negative logical product (NAND) processing, the direction of magnetization of soft magnetic part SM2 is anti-parallel to the magnetization direction of HM1, that is, leftward in the case of FIG. 12C. The direction of magnetization of soft magnetic part SM2 can be controlled by passing a current of a predetermined amount in a predetermined direction through the electrodes E3 and E4.

Thus, according to the relation of magnetization arrangement, the logical product (AND) processing can be performed as shown in FIGS. 12A and 12B, and the negative logical product (NAND) processing can be performed as shown in FIGS. 12C and 12D.

Figures 13A, 13C:
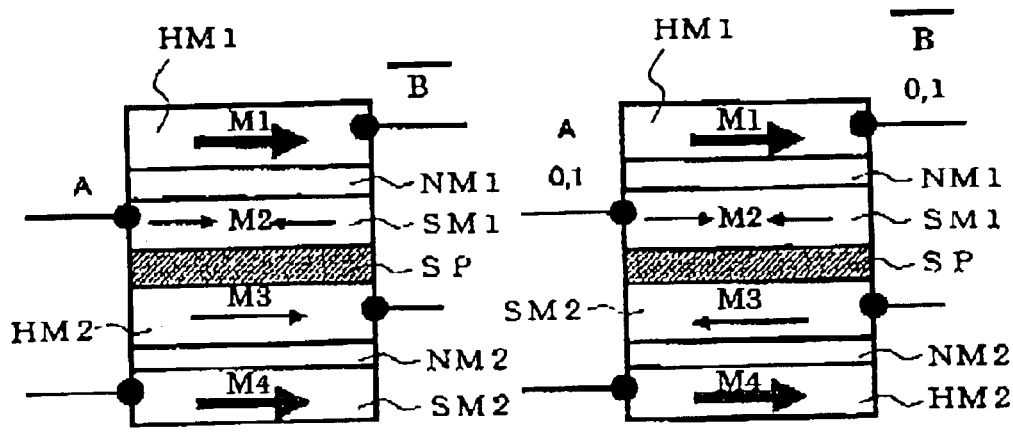

FIGS. 13A and 13B show the example which performs negative logical sum (NOR) processing using the magnetic logic element of this embodiment.

FIGS. 13C and 13D show the example which performs logical sum (OR) processing using the magnetic logic element of this embodiment.

In any of these cases, signal A and signal B are inputted into the electrodes E2 and E1, respectively. However, signal B is reversed. Moreover, in the case of a logical sum (OR)

processing, the direction of magnetization of soft magnetic part SM2 is anti-parallel to the magnetic direction of HM1, that is, leftward in the case of FIG. 13C, while in the case of negative logical sum (NOR) processing, the direction of magnetization of soft magnetic part SM2 is parallel to the magnetic direction of HM1, HM2, that is, rightward in the case of FIG. 13A. The direction of magnetization of soft magnetic part SM2 can be controlled by passing a current of a predetermined amount in a predetermined direction through the electrodes E3 and E4.

Thus, according to the relation of magnetization arrangement, the negative logical sum (NOR) processing can be performed as shown in FIGS. 13A and 13B, and the logical sum (OR) processing can be performed as shown in FIGS. 13C and 13D.

In the examples shown in FIGS. 5, 8–12, the magnetic directions of HM1 and HM2 are in parallel. However, anti-parallel relation between the magnetic directions of HM1 and HM2 can also be used by changing the input signals appropriately.

Figure 14A:
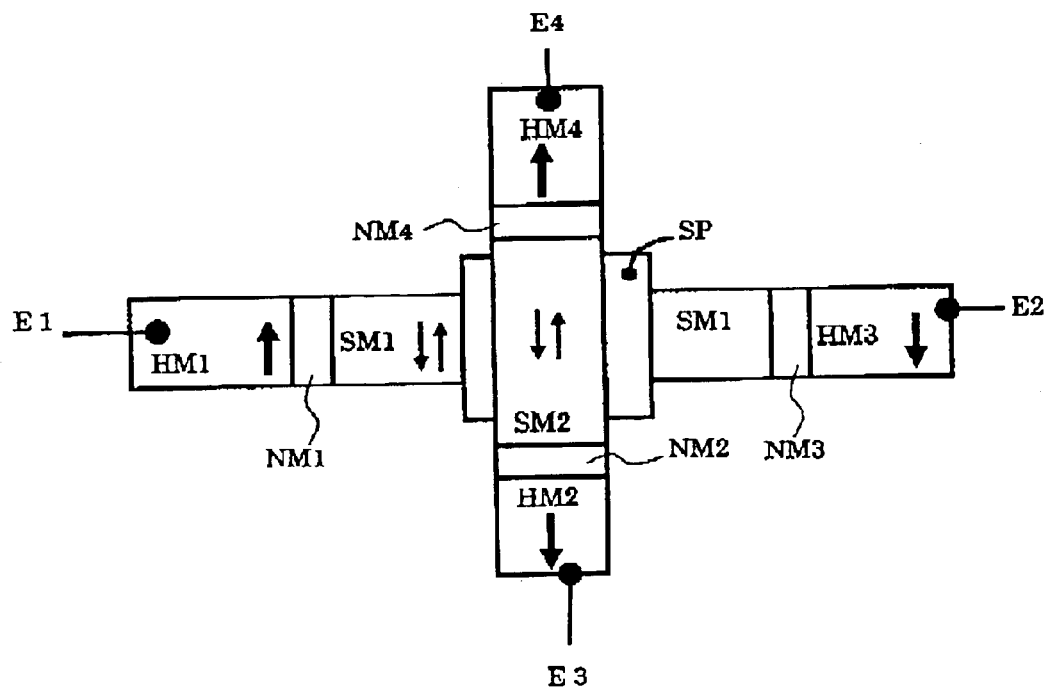
FIG. 14A shows the plane view.
Figure 14B:
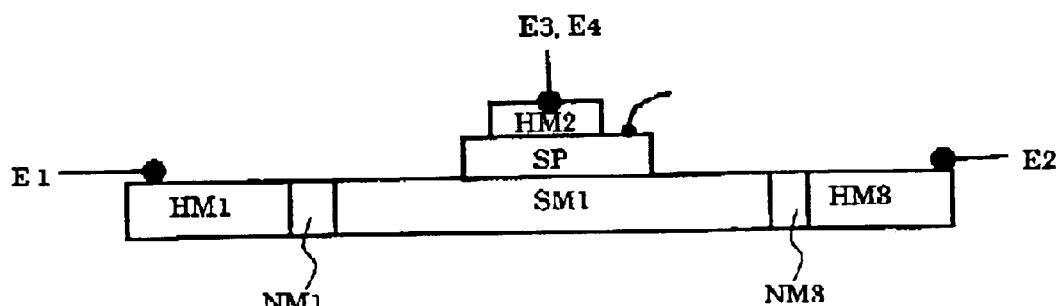
FIG. 14B shows the elevational view of the example.

FIGS. 14A and 14B are schematic diagrams showing the structure of the magnetic logic element of the example of transformation of this embodiment. That is, FIG. 14A shows the plane view, and FIG. 14B shows the elevational view. In this example, through the MR intermediate part SP, two structures of thin lines are arranged in a crossing fashion.

In the lower structure of a thin line, a hard magnetic part HM1, a spin transfer intermediate part NM1, a soft magnetic part SM1, a spin transfer intermediate part NM3, and a hard magnetic part HM3 are arranged in this order.

In the upper structure of a thin line on the top of the MR intermediate part SP, a hard magnetic part HM2, a spin transfer intermediate part NM2, a soft magnetic part SM2, a spin transfer intermediate part NM4, and a hard magnetic part HM4 are arranged in this order.

Lower soft magnetic part SM1 and upper soft magnetic part SM2 are laminated through the MR intermediate part SP. The size of the MR intermediate part SP is the same as the overlap part of soft magnetic part SM1 and a hard magnetic part HM2, or needs to be more than the overlap.

Therefore, the MR intermediate part SP may cover soft magnetic part SM1 altogether, or it may further extend to cover to the spin transfer intermediate part NM. What is necessary is just to be able to connect electrodes E1 and E2. As for the magnetization direction of a hard magnetic part HM3, it is desirable to be in anti-parallel to the magnetization of the hard magnetic part HM1.

The spin transfer intermediate part enables it to turn the magnetization directions of the hard magnetic part HM1 and the soft magnetic part SM1, or the magnetization directions of the soft magnetic part SM1 and the hard magnetic part HM3 to anti-parallel, respectively. If electrons are passed from E1 to E2 to this magnetic logic element using electrodes E1 and E2, magnetization of the soft magnetic part SM1 will turn to The same direction as the hard magnetic part HM1.

Conversely, if electrons are passed from an electrode E2 to E1, magnetization of soft magnetic part SM1 will turn into the same direction as the hard magnetic part HM3. Also in upper thin line structure, the same magnetization writing is possible.

In the above, the magnetic logic elements of the first embodiment of the invention and the examples of logic processing using these are explained, referring to FIGS. 1 through 14B. By using the same element, six kinds of logic processing can be performed.

(Second Embodiment)

Next, the second embodiment of the invention will be explained.

Figure 15:
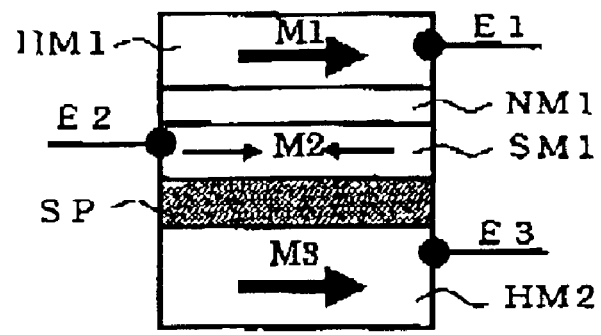
FIG. 15 is a schematic diagram which exemplifies the principal part section structure of The magnetic logic element according to the second embodiment of the invention.

FIG. 15 is a schematic diagram which exemplifies the principal part section structure of the magnetic logic element according to the second embodiment of the invention.

That is, the magnetic logic element of this embodiment has the structure where a hard magnetic part HM1, a spin transfer intermediate part NM1, a MR intermediate part SP, and a hard magnetic part HM2 are laminated in this order. The magnetization of the hard magnetic parts HM1 and HM2 are fixed to be kept parallel or anti-parallel.

And electrodes E1–E3 are connected to the hard magnetic part HM1, the soft magnetic part SM1, and the hard magnetic part HM2, respectively.

About the materials, thicknesses, plane forms, and sizes of these hard magnetic parts HM1 and HM2, the spin transfer intermediate part NM1, soft magnetic part SM1, and the MR intermediate part SP, it may be set like what was mentioned above about the first embodiment.

Also in the magnetic logic element of this embodiment, by passing a writing current between the electrodes E1 and E2, the magnetization M2 of soft magnetic part SM1 can be controlled by a spin-polarized current, as mentioned above about FIGS. 6A and 6B Moreover, the relative relation between the direction of the magnetization M2 of the soft magnetic part SM1 and the direction of the magnetization M3 of the hard magnetic part HM2 is detectable with the magnetoresistance effect as what was mentioned above with reference to FIGS. 7A and 7B, by passing a sense current between the electrodes E2 (or electrode E1) and E3.

Figure 16:
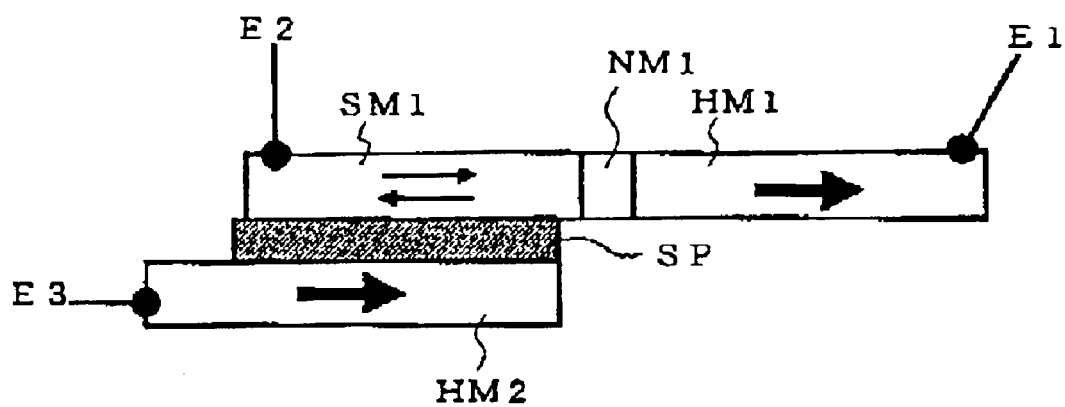
FIG. 16 is a schematic sectional view showing another example of transformation of the magnetic logic element of the embodiment.

FIG. 16 is a schematic sectional view showing another example of transformation of the magnetic logic element of this embodiment. The same symbols are given to the similar elements as what was mentioned above about FIG. 15 about the figure, and detailed explanation will be omitted.

In this example of transformation, soft magnetic part SM1 and a hard magnetic part HM2 are laminated on upper and lower sides of the MR intermediate part SP, respectively. However, the spin transfer intermediate part NM1 and the hard magnetic part HM1 are laterally provided. That is, the spin transfer intermediate part NM1 and the hard magnetic part HM1 are adjoined and provided in the direction of the film plane of the field to soft magnetic part SM1, without laminating in the direction of thickness.

Even if each part of the magnetic logic element is arranged in such a fashion, the input operation by the spin-polarized current as mentioned above with reference to FIGS. 6A and 6B, and the output operation by the magnetoresistance effect as mentioned above with reference to FIGS. 7A and 7B can be performed.

Moreover, although the MR intermediate part SP may be formed as a single insulating layer, the effect mentioned above with reference to FIGS. 8A through 8D can be similarly acquired by providing a magnetic nanocontact P.

In the magnetic logic elements of this embodiment which are shown in FIGS. 15 and 16, logic processing is possible FIGS. 17A through 17D are conceptual diagrams explaining the logic processing in the magnetic logic element according to this example. The magnetic logic element of this embodiment determines the direction of the magnetization M2 of soft magnetic part SM1 according to the input signals A and B inputted to the electrodes E2 and E1, respectively.

FIGS. 17A and 17B show the case where logical product (AND) processing is performed. That is, in case logical product processing is performed, the direction of the magnetization M3 of the hard magnetic part HM2 is fixed to be parallel to the direction of the magnetization M1 of the hard magnetic part HM1. That is, the direction of M3 is made rightward in FIG. 17A. And signal B is inputted into an electrode E1, and signal A is inputted into an electrode E2. Corresponding to input signal "0", zero volt (lower potential) may be applied. Corresponding to an input signal "1", a predetermined positive voltage (higher potential) which can cause magnetization switching is applied. Then, current flows according to the combination of the applied voltage, and the direction of the magnetization M2 of soft magnetic part SM1 is determined by the direction of the current.

First, it is initialized by passing electron current from an electrode E1 to an electrode E2 so that the magnetization M2 of introduction soft magnetic part SM1 may turn to the right. Next, only a signal A is reversed and inputted into the electrode E2, while signal B is inputted into the electrode E1 in a form as it is. The outputs of the result are as shown in the truth table of FIG. 17B, and it is understood that a logical product (AND) is realized.

Next, FIGS. 17C and 17D show the example where negative logical product (NAND) processing is performed. In this case, direction of a hard magnetic part HM2 is fixed to be anti-parallel to the direction of the magnetization M1 of the hard magnetic part HM1. That is, the direction of M3 is made leftward in FIG. 17C. With regard to the inputs corresponding to signals A and B, only signal A is reversed as shown in FIG. 17C. The outputs of the result are as shown in the truth table of FIG. 17D, and it is understood that a negative logical product (NAND) is realized.

Next, FIGS. 17E and 17F show the example where negative logical sum (NOR) processing is performed. In this case, the magnetization direction of the hard magnetic part HM2 is fixed to be parallel to the direction of the magnetization M1 of the hard magnetic part HM1. That is, the direction of M3 is made rightward in FIG. 17E, beforehand. Signal A is inputted to the electrode E2 as it is, while signal B is reversed and inputted to the electrode E1. The outputs of the result are as shown in the truth table of FIG. 17F, and it is understood that a negative logical sum (NOR) is realized.

Furthermore, FIGS. 17G and 17H show the example where a logical sum (OR) processing is performed. In this case, the magnetization direction of the hard magnetic part HM2 is fixed to be anti-parallel to the direction of the magnetization M1 of the hard magnetic part HM1. That is, the direction of M3 is made leftward in FIG. 17G, beforehand. Signal A is inputted to an electrode E2 as it is, while signal B is reversed and inputted to the electrode E1. The outputs of the result are as shown in the truth table of FIG. 17H, and it is understood that a negative logical sum (NOR) is realized.

As shown in FIGS. 17A through 17H above, by using the same element, four kinds of logic processing can be performed.

FIGS. 18A through 18D are diagrams showing the example where exclusive OR (EOR) processing is performed using the magnetic logic element of this embodiment.

That is, EOR processing are attained by combining two cells (10A and 10B) of the magnetic logic element of this embodiment which was shown to FIGS. 15 or 16 as one set. In This case, the direction of the magnetization M2 of soft magnetic part SM1 is determined according to input signals A and B, respectively.

Signal B is inputted into an electrode E1, and signal A is inputted into an electrode E2. A zero volt (lower potential) and a predetermined positive voltage (higher potential) are applied corresponding to the input signals "0" and "1", respectively, in this case. Then, current will flow according to the combination of applied voltages, and the direction of the magnetization M2 of soft magnetic part SM1 is determined according to the direction of the current.

Both cells are initialized by passing electron current from the electrode E1 to the electrode E2 so that the magnetization M2 of the soft magnetic part SM1 may turn to the right. Next, signal A and signal B are inputted into the first cell 10A as it is (FIG. 18A), while signal A and signal B are both reversed and inputted into the second cell 10B (FIG. 13C).

FIGS. 18B and 18D are the truth tables for the first and second cells. The magnetoresistance effect between the soft layers SM 1 and the hard layers HM2 through the MR intermediate part SP is detected as the output. Further, if signal B is "0", the output from the second cell 10B is read. Instead, if the signal B is "1", the output from the first cell 10A is read. As a result, exclusive OR can be obtained.

On the other hand, FIGS. 19A through 19D show the example where negative exclusive OR (NEOR) processing is performed. Here, after initializing the first and second cells (10A and 10B), reversed signal A and normal signal B are inputted into the first cell 10A (FIG. 19A), while a normal signal A and reversed signal B are inputted into the second cell 10B (FIG. 19C).

Like the EOR processing, if signal B is "0", the output from the second cell is read. Instead, if signal B is "1", the output form the first cell is read. Consequently, negative exclusive OR (XNOR) can be performed. In the examples shown in FIGS. 18 and 19, the magnetic directions of HM1 and HM2 are in parallel. However, anti-parallel relation between the magnetic directions of HM1 and HM2 can also be used by changing the input signals appropriately.

Figure 20:
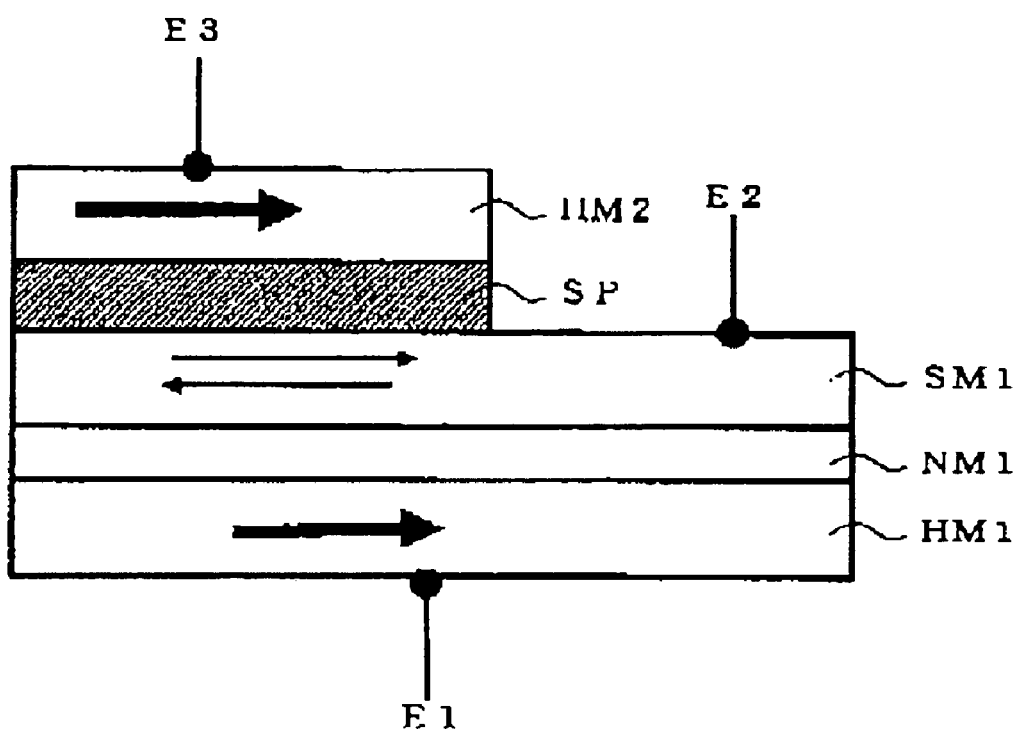
FIG. 20 is a schematic sectional view showing the structure of the magnetic logic element of the example of transformation of the embodiment.

FIG. 20 is a schematic sectional view showing the structure of the magnetic logic element of the example of transformation of this embodiment. In this example, a hard magnetic part HM1, a spin transfer intermediate part NM1, and a soft magnetic part SM1 are laminated, and the electrode E2 is connected to the upper end of soft magnetic part SM1. Further, the MR intermediate part SP and a hard magnetic part HM2 are laminated on the remaining portion of soft magnetic part SM1, and the electrode E3 is connected on the hard magnetic part HM2. The element of this example can also perform the same operation as what was explained with reference to FIG. 15.

Figure 21A:
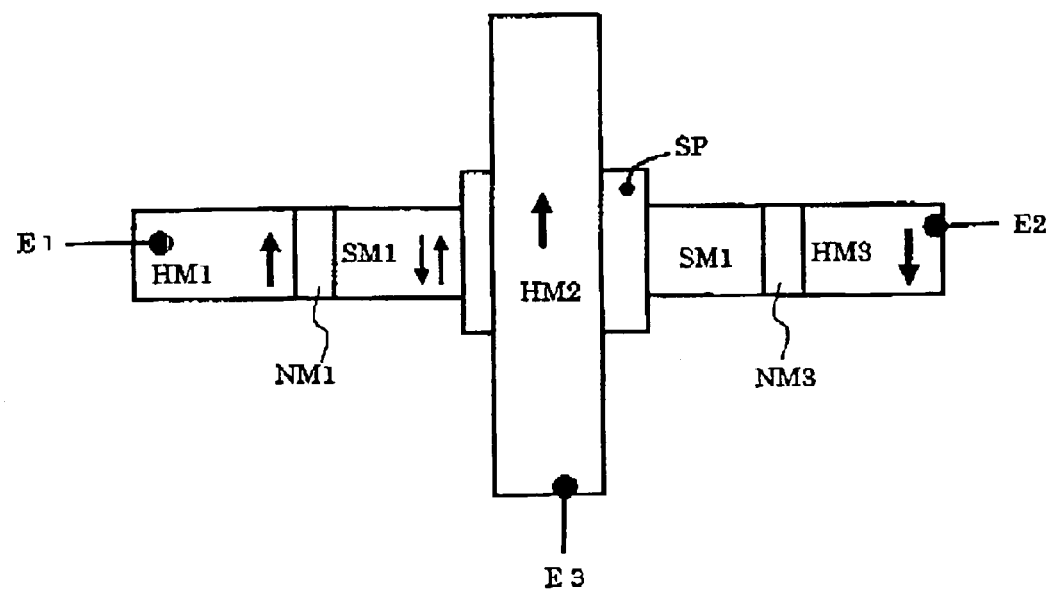
FIGS. 21A and 21B are schematic diagrams showing the structure of the magnetic logic element of another example of transformation of the embodiment, where
Figure 21B:
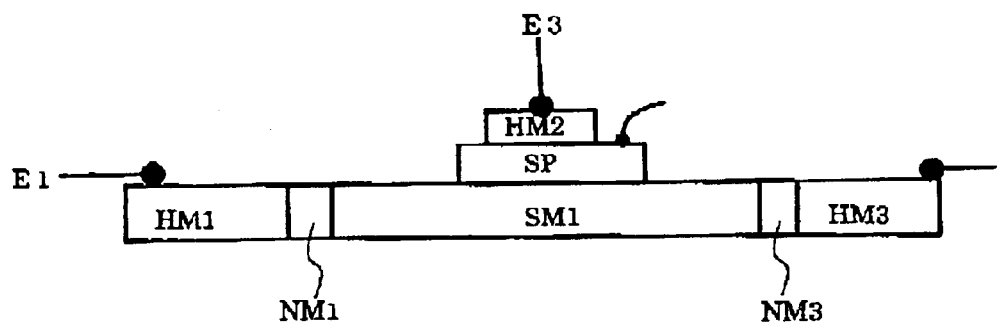

FIGS. 21A and 21B are schematic diagrams showing the structure of the magnetic logic element of another example of transformation of this embodiment, That is, FIG. 21A shows the plane view, and FIG. 21B shows the elevational view.

In this example of transformation, through the MR intermediate part SP, two structures of a thin line are provided in a crossing fashion. In the lower structure of a thin line, a hard magnetic part HM1, a spin transfer intermediate part NM1, a soft magnetic part SM1, a spin transfer intermediate part NM3, and a hard magnetic part HM3 are arranged in this order. The thin line on the MR intermediate part SP is formed of a hard magnetic part HM2. Here, the size of the MR intermediate part SP is the same as the overlap part of the soft magnetic part SM1 and the hard magnetic part HM2, or needs to be more than it. Therefore, the MR intermediate part SP may cover the soft magnetic part SM1 altogether, or it may further extend to cover the spin transfer intermediate pan NM. What is necessary is just to be able to connect electrodes E1 and E2.

As for the magnetization direction of the hard magnetic part HM3, it is desirable to anti-parallel to the magnetization direction of the hard magnetic part HM1. The spin transfer intermediate part enables it to turn the magnetization directions of the hard magnetic part HM1 and the soft magnetic part SM1, or the directions of the soft magnetic part SM1 and the hard magnetic part HM3 anti-parallel, respectively.

If electrons are passed from E1 to E2 to this magnetic logic element using electrodes E1 and E2, magnetization direction of soft magnetic part SM1 will be the same as the magnetization direction of the hard magnetic part HM1. Conversely, if electrons are passed from the electrode E2 to E1, magnetization direction of the soft magnetic part SM1 becomes the same as the magnetization direction of the hard magnetic part HM3.

In the above, magnetic logic elements according to the second embodiment of the invention and the example of logic processing using the magnetic logic elements were explained, referring to FIGS. 15 through 21B.

(Third Embodiment)

Next, the third embodiment of the invention will be explained.

Figure 22A:
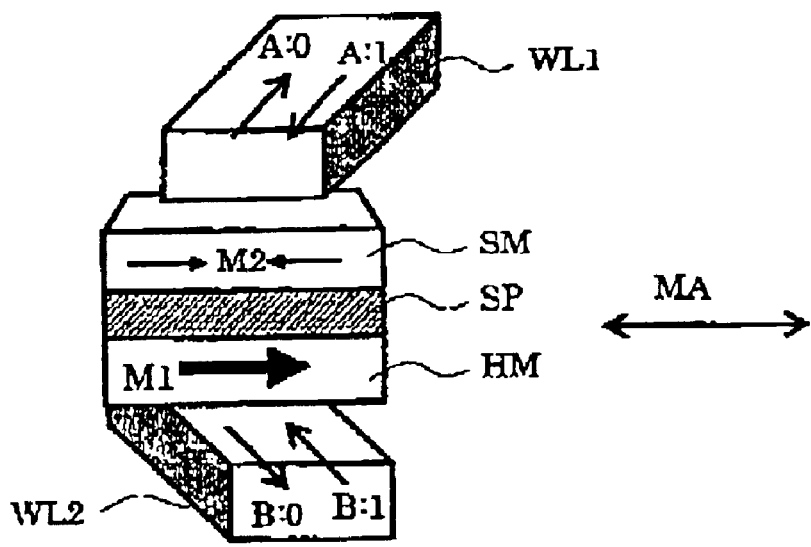
FIGS. 22A and 22B are schematic diagrams which show the magnetic logic elements according to the third embodiment of the invention.
Figure 22B:
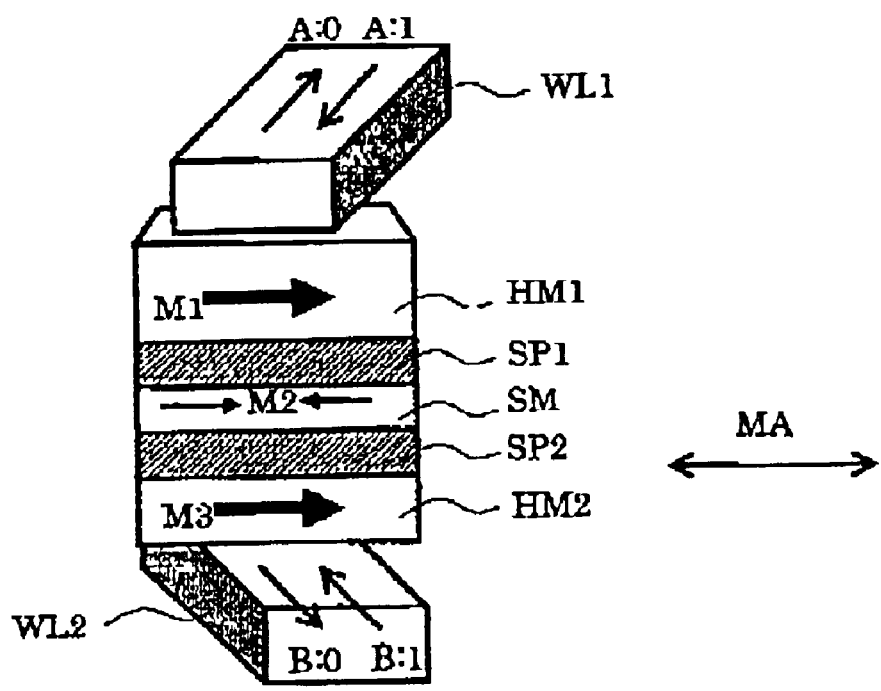

FIGS. 22A and 22B are schematic diagrams which show the magnetic logic elements according to the third embodiment of the invention. In these figures, the direction of the magnetic anisotropy is shown by the arrow MA.

In the case of the example shown in FIG. 22A, a hard magnetic part (or a semi hard layer) HM, a MR intermediate part SP, and a soft magnetic part SM are laminated in this order. Further, the leads WL1 and WL2 to generate a current magnetic field are provided near the laminated structure.

In the case of the example shown in FIG. 22B, a hard magnetic part (or a semi hard layer) HM2, a MR intermediate part SP2, and a soft magnetic part SM, MR intermediate part SP1, hard magnetic part HM1 are laminated in this order. Then, the leads WL1 and WL2 to generate a magnetic field are provided near the laminated structure. The leads WL1 and WL2 intersect around the laminated structure.

In any case of FIG. 22A and 22B, the direction of the magnetization M2 of soft magnetic part SM is determined by the synthetic magnetic field of the magnetic field which is generated by passing a current to each of two crossing leads WL1 and WL2.

Moreover, in a laminated structure, as mentioned above with reference to FIGS. 7A and 7B, the relative relation of magnetizations between the soft magnetic part SM and the hard magnetic part HM1 (or HM2) is detected by the magnetoresistance effect.

And in the case of this embodiment, directions of the currents passed to leads WL1 and WL2 are determined corresponding to the input signals A and B, respectively, and the amount of the magnetoresistance of the laminated structure is made into the output signal C. For example, directions of the current passed through the upper lead WL1 is made to correspond to signal A. That is, if signal A is "0", current is passed in the going direction in the figure, and if signal A is "1", the current is passed in a coming direction.

Moreover, directions of the current passed through the lower lead WL2 is assigned to signal B. For example, if signal B is "0", the current is passed in the coming direction, and if the signal B is "1", the current is passed in the going direction.

In using as a programmable magnetic logic element, a semi hard magnetic material may be used for the hard magnetic part HM1 (HM2). The direction of the magnetization M1 (M3) of this layer is beforehand determined according to logic processing to be performed by the current magnetic field by using the leads WL1 and WL2. That is, as for the direction of the magnetization M1 (M3) of the semi hard layer HM1 (HM2), it may be programmed beforehand to be rightward for "0", and to be leftward for "1" as shown in FIGS. 22A and 22B.

Moreover, after initializing so that the direction of the magnetization M2 of soft magnetic part SM may be the rightward (namely, "0") in FIGS. 22A and 22B, the logic processing will be started.

In the cases of negative logical product (NAND) and a logical product (AND), the input each of signals A and B are inputted as it is. In the cases of negative logical sum (NOR) and logical sum (OR), the both input signals A and B are reversed and Inputted.

Tables 1–4 show inputs and outputs of NAND, AND, OR, and NOR processing.

Furthermore, also in this embodiment, exclusive OR (EOR) and its negative (NEOR) processing are attained by making two cells into one set.

FIGS. 23A through 23D show such a combination of two cells. In FIG. 23A and 23C, the direction of the magnetic anisotropy is shown by the arrow MA In performing EOR processing, the magnetization M1 (M3) of a hard magnetic part (semi hard layer) HM1 (HM2) is set in rightward (namely, "0") as shown in FIGS. 23A and 23C. And the magnetization M2 of soft magnetic part SM is initialized so that it may become rightward. Signals A and B are inputted into the first cell 10A (FIG. 23A) without reversing them. In contrast, these signals A and B are reversed and inputted into the second cell 10B (FIG. 23C).

The output signals obtained by the magnetoresistance effect between the hard magnetic part HM1 (HM2) and the soft magnetic part SM from the first and second cells are shown in FIGS. 23B and 23D, respectively.

EOR can be performed, by reading the second cell 10B, if signal B is "0", and by reading the first cell 10A, if signal B is "1".

Moreover, NEOR is realized by setting the magnetization of the hard layer or the semi hard layer into leftward (namely, "1") in FIG. 23A and 23C.

EXAMPLES

Hereafter, the embodiments of the invention will be explained in more detail referring to the examples.

First Example

Figure 24:
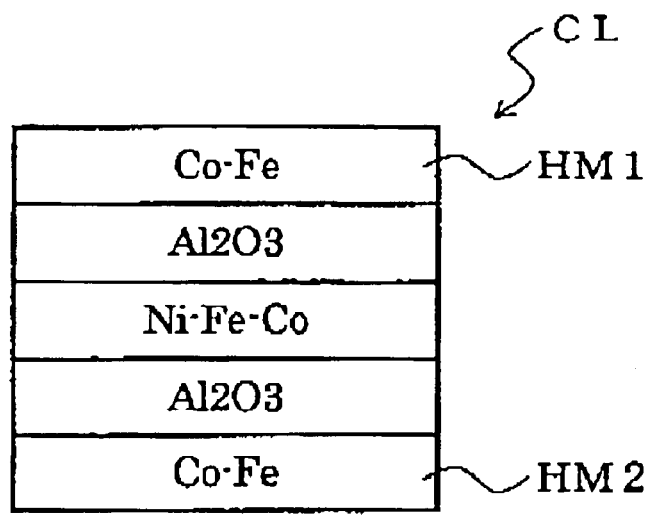
FIG. 24 shows the sectional structure of the first example of the invention.
Figure 25:
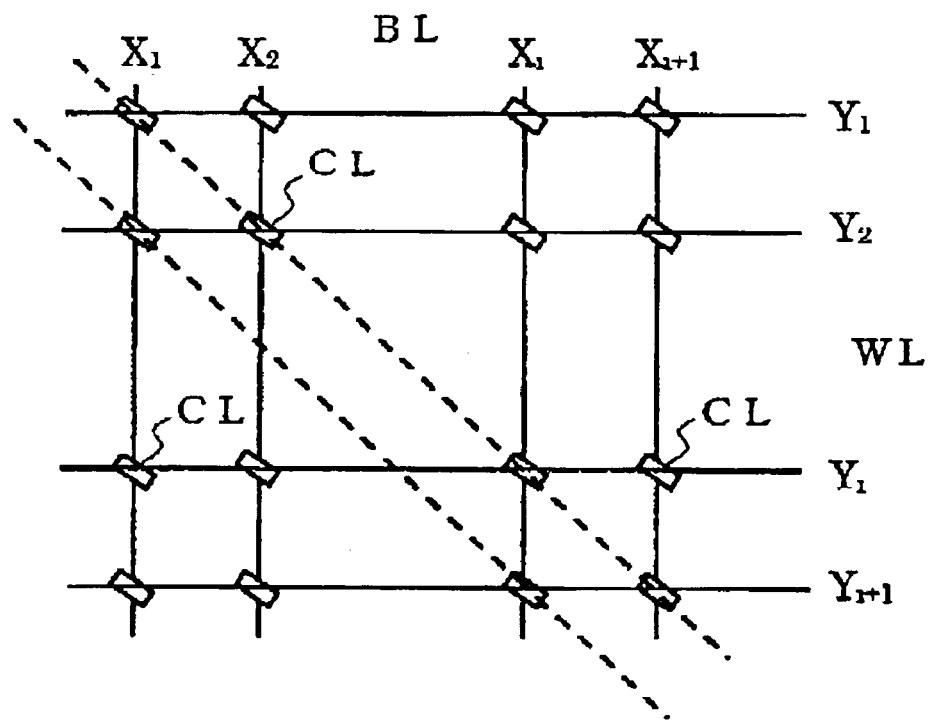
FIG. 25 shows the element array fabricated as the first example of the invention.

First, as a first example of the invention, an element CL having a double tunnel junction which has the cross-sectional structure shown in FIG. 24 was fabricated. As shown in FIG. 24, the element CL has a semi hard layer HM1 made of Co—Fe alloy, a MR intermediate part MR1 made of $Al_2O_3$, a soft magnetic part SM made of Ni—Fe—Co alloy, a MR intermediate part MR2 made of $Al_2O_3$, and a semi hard layer HM2 made of Co—Fe alloy stacked in this order. These elements CL were arranged in the form of an array, as shown in FIG. 25. And the signal input was enabled by the magnetic field using the bit line BL and the word line WL.

In addition, in the element array shown in FIG. 25, one transistor (not shown) for cell selection was provided for every cell, and the word lines for selecting these transistors were also formed.

The magnetic body of the center of the element CL which has a double tunnel junction is soft magnetic part SM. Magnetization of this layer SM is changed according to a signal input by the synthetic magnetic field formed by the bit line BL and the word line WL.

Moreover, according to operation processing to be performed, the magnetization directions of the semi hard layers HM1 and HM2 of top and bottom of element CL were determined beforehand. Magnetization switching (namely, reversal of magnetization) of these semi hard layers HM1 and HM2 can also be performed by passing current to the bit line BL and the word line WL. However, in this case, larger currents than magnetization switching of soft magnetic part SM are required. At this time, magnetization of the soft magnetic part is also simultaneously switched by the large current magnetic field. However, since magnetization of soft magnetic part SM is initialized rightward in FIGS. 22A and 22B first, before the operation processing, it is not the problem.

When the magnetic field is insufficient to switch the semi hard layers HM1 and HM2, an auxiliary lead as shown in FIG. 25 expressed as the dotted line can be provided, and a generating magnetic field can be enlarged by passing current to this auxiliary lead.

Figure 26:
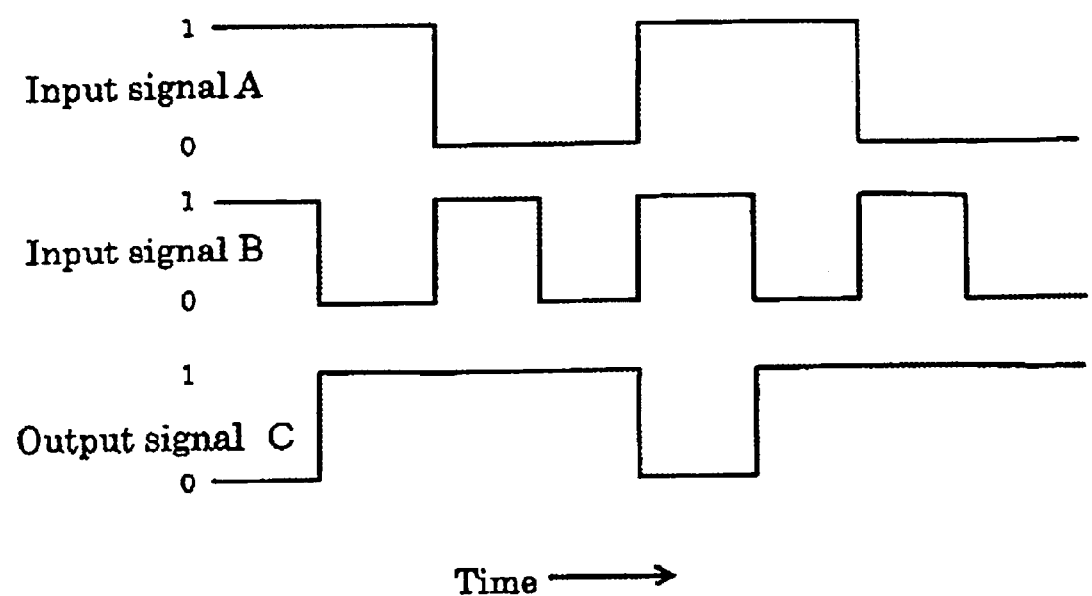
FIG. 26 shows the result of the first example of the invention.

Signal A and signal B were inputted into this element, and the relation between input signals A and B and an output signal C was observed with an oscilloscope. FIG. 26 shows waveforms of the input signals A and B and the output signal C observed by the oscilloscope. That is, the timing between the input signals and the output signal is shown in FIG. 26. The input signals A and B are in either of 0-level and 1-level, and change with a different period to each other. The corresponding waveform of the output signal C is shown below the waveform of the input signal B in FIG. 26. As shown in FIG. 26, the output signal C becomes 0 when the input signals A and B are both 1. The output C becomes 1 when the input signal A is 1 and the input signal B is 0. The output signal C becomes 1 when the input signal A is 0 and the input signal B is 1. The output signal C becomes 1 when the input signal A is 0 and the input signal B is 0. The result is shown in FIG. 26, with which it was confirmed that NAND processing has been realized.

Second Example

Next, as a second example of the invention, the EOR memory which performs one EOR processing and records was produced by combining two elements of the first example mentioned above. Here, magnetization of the semi hard layers HM1 and HM2 was programmed rightward in FIGS. 22A and 22B. And after initializing magnetization of soft magnetic part SM rightward first, signal A and signal B were inputted into the first cell as they were, and both signals A and B were reversed and inputted into the second cell.

The truth tables obtained as the result were the same as Tables 1–4.

If a data signal is inputted as a signal A and an encryption key signal is inputted as a signal B, data can be saved as a stream cipher using two elements responding to one bit. Reproduction will be performed by reading the second cell, if the encryption key is "0", and by reading the first cell, if the encryption key is "1".

Third Example

Next, as a third example of the invention, the magnetic logic element which has the structure of FIG. 5 will be explained. Both the hard magnetic parts HM1 and HM2 were Co—Fe alloys, and soft magnetic parts SM1 and SM2 consisted of a laminated structure which consists of Co—Fe (0.6 nm)/Ni—Fe(0.8 nm)/Co—Fe (0.6 nm), or Co—Fe(1.5 nm)/Ru(1 nm)/Co—Fe (1.5 nm).

Cu of 5 nm thickness was used for the spin transfer intermediate parts NM1 and NM2, and alumina of 1 nm through 2 nm in thickness was used for the MR intermediate part SP.

Moreover, the Co—Fe film/PtIrMn film was laminated in the outside of hard magnetic parts HM1 and HM2 through a ruthenium (Ru) layer, in order to fix the magnetizations of hard magnetic parts HM1 and HM2 completely.

After forming such a laminated structure, the element array with each element size of (30 nm–150 nm)×(60 nm–300 nm) was fabricated by using micro-fabrication technique. In order to put the electrode, the area of some layers of the laminated structure inside of the element was reduced.

By the measurements of current dependence of the resistance, it was confirmed that the switching current of these elements was around plus minus 1 mA. Then the reversal voltage required to reverse the magnetization was calculated. And a voltage whose absolute value was slightly larger than the reversal voltage was set as the input signal of higher value. And data writing was performed by inputting a data signal to be saved as signal A, and by inputting an encryption key signal as signal B.

As a result, data was recorded as a stream cipher which was scrambled by the encryption key. Thus, a memory with an encryption processing function was realized. Only the user who knows the encryption key signal can decode the data stored in this memory.

Fourth Example

Next, as a fourth example of the invention, the fabricating method of the magnetic element of the structure where two thin lines are crossed as shown in FIG. 14 will be explained.

FIGS. 27A through 27D show planar views showing the manufacture method of the magnetic element of this example.

First, the magnetic film which becomes the hard magnetic part HM1, the spin transfer intermediate part NM1, soft magnetic part SM1, the spin transfer intermediate part NM3, and the hard magnetic part HM3 is formed.

Figure 27A:
FIGS. 27A through 27D show planar views showing the manufacture method of the magnetic element of the example.
Figure 27B:
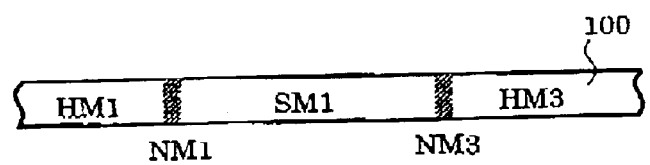

A resist is applied on the film and a thin line mask is formed using EB drawing equipment. And by using a reactive ion etching equipment, portions other than a thin line were etched, and thus, the thin line 100 was formed as shown in FIG. 27A. By performing an electron beam scanning to this thin line on the line of L1 and L2 shown in FIG. 27A, the spin transfer intermediate parts NM1 and NM2 which consist of a crystal deterioration part were formed as shown in FIG. 27B.

Figure 27C:
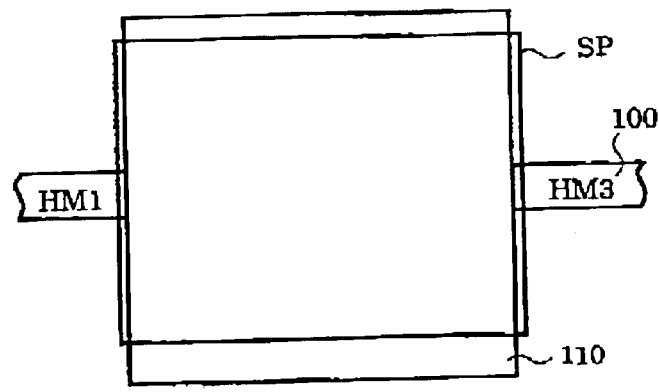
Figure 27D:
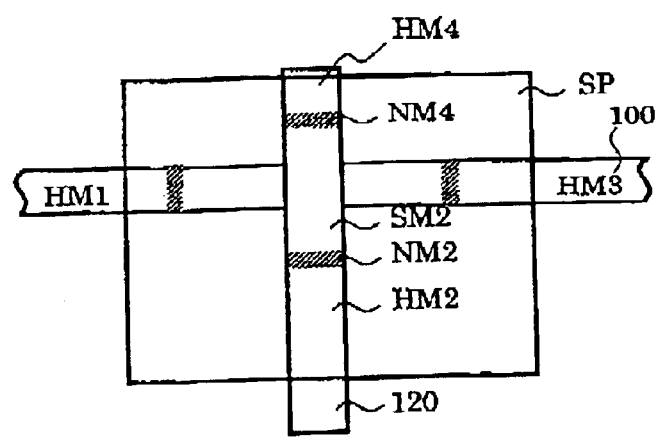

Next, as shown in FIG. 27C, the MR intermediate part SP was laminated on the thin line 100. And the magnetic layer 110 for a hard magnetic part HM2, the spin transfer intermediate part NM2, soft magnetic part SM2, the spin transfer intermediate part NM4, and the hard magnetic part HM4 was further formed on it. And this magnetic layer 110 was formed into a thin line by the same method as what was mentioned above about FIG. 27A At this time, the direction of the thin line 120 was set so that it may become substantially perpendicular to the thin line 100.

In order to make the magnetization directions of the hard magnetic part HM1 and also HM4, they have the same direction and the hard magnetic part HM3 and also HM2, HM3 and HM2 have the same direction anti-parallel, the PtMn pads were directly laminated on the hard magnetic parts HM3 and HM2. The PtMn pad were laminated through the Ru (about 1 nm of thickness) film in The hard magnetic parts HM3, HM2. And finally wirings were formed.

By the method explained above, the magnetic logic element which has two crossing thin lines with a width of 50 nm can be formed through the MR intermediate part SP.

Heretofore, the embodiment of the invention was explained, referring to an example. However, the invention is not limited to these examples.

For example, material, shape and thickness of the each layer of the magnetic logic element according to the invention may be appropriately selected by those skilled in the art within the known techniques to carry out the invention as taught in the specification and obtain equivalent effects.

Also each of these layers of the magnetic logic element of the invention may be formed as a single layer, or may have a multi-layered structure.

Although the structures laminated as shown in the figures were mentioned as the examples and explained about explanation of logic of operation, the invention is not limited to this. For example, as shown in FIG. 14, 21, etc., as long as the element is equivalent in topology, logic operation can be carried out similarly and these elements are also included in the range of the invention. In addition, the shape of the element, the input form of the input signals, and the output form of the output signals can also be modified by those skilled in the art.

Further, also concerning the magnetic logic element array according to the invention, those skilled in the art will be able to carry out the invention by appropriately selecting a material or a structure within the known techniques.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

TABLE 1

| NAND | | | | |
|---|---|---|---|---|
| setting of semi hard magnetic part HM1 | 0 | | | |
| input form | A: as it is, B: as it is | | | |
| input signal A | 0 | 0 | 1 | 1 |
| input signal B | 0 | 1 | 0 | 1 |
| output signal C | 1 | 1 | 1 | 0 |

TABLE 2

| AND | | | | |
|---|---|---|---|---|
| setting of semi hard magnetic part HM1 | 1 | | | |
| input form | A: as it is, B: as it is | | | |
| input signal A | 0 | 0 | 1 | 1 |
| input signal B | 0 | 1 | 0 | 1 |
| output signal C | 0 | 0 | 0 | 1 |

TABLE 3

| OR | | | | |
|---|---|---|---|---|
| setting of semi hard magnetic part HM1 | 0 | | | |
| input form | A: reversed, B: reversed | | | |
| input signal A | 0 | 0 | 1 | 1 |
| input signal B | 0 | 1 | 0 | 1 |
| output signal C | 0 | 1 | 1 | 1 |

TABLE 4

| NOR | | | | |
|---|---|---|---|---|
| setting of semi hard magnetic part HM1 | 1 | | | |
| input form | A: reversed, B: reversed | | | |
| input signal A | 0 | 0 | 1 | 1 |
| input signal B | 0 | 1 | 0 | 1 |
| output signal C | 1 | 0 | 0 | 0 |

What is claimed is:

1. A magnetic logic device comprising a magnetic logic element cell having;
   a first and second magnetic parts;
   a MR intermediate part provided between the first and second magnetic parts; and
   a magnetization controlling part that controls a relation of directions of magnetizations of the first and second magnetic parts in accordance with a combination of a first binary input data and a second binary input data,
   wherein a binary output data is able to read by detecting a magnetoresistance effect of the first and second magnetic parts through the MR intermediate part.

2. A magnetic logic device comprising:
   a first hard magnetic part including a first ferromagnetic substance pinned in magnetization substantially in a first direction;
   a second hard magnetic part including a second ferromagnetic substance pinned in magnetization substantially in a second direction;
   a MR intermediate part provided between the first and second hard magnetic parts;
   a first soft magnetic part provided between the first hard magnetic part and the MR intermediate part, and having a third ferromagnetic substance;
   a second soft magnetic part provided between the second hard magnetic part and the MR intermediate part, and having a fourth ferromagnetic substance;
   a first spin transfer intermediate part provided between the first hard magnetic part and the first soft magnetic part;
   a second spin transfer intermediate part provided between the second hard magnetic part and the second soft magnetic part; and
   a controlling unit which passes a first writing current between the first hard magnetic part and the first soft magnetic part in correspondence with a first logic input signal to direct a magnetization of the third ferromagnetic substance in a direction substantially parallel or anti-parallel to the first direction,
   the controlling unit passing a second writing current between the second hard magnetic part and the second soft magnetic part in correspondence with a second logic input signal to direct a magnetization of the fourth ferromagnetic substance in a direction substantially parallel or anti-parallel to the second direction, and the controlling unit reading a logic output based on a relative relation of the directions of magnetizations of the third and fourth ferromagnetic substances, by passing a sense current between the first and second soft magnetic parts.

3. A magnetic logic device according to claim 2, wherein a first spin-polarized electronic current flows in the first soft magnetic part by passing the first writing current, and the magnetization of the third ferromagnetic substance is directed in the direction parallel or anti-parallel by the first spin-polarized electronic current, and wherein a second spin-polarized electronic current flows in the second soft magnetic part by passing the second writing current, and the magnetization of the fourth ferromagnetic substance is directed in the direction parallel or anti-parallel by the second spin-polarized electronic current.

4. A magnetic logic device according to claim 2, wherein a resistance measured by the sense current varies depending on the relative relation of the directions of magnetizations of the third and fourth ferromagnetic substance.

5. A magnetic logic device according to claim 2, wherein the MR intermediate part is made of an electrically insulating material.

6. A magnetic logic device according to claim 2, wherein a magnetic nanocontact including a portion extending out from the adjoining soft magnetic part is formed in the MR intermediate layer.

7. A magnetic logic device according to claim 2, wherein the third and the fourth ferromagnetic substances are magnetically softer than the first and second ferromagnetic substances.

8. A magnetic logic device according to claim 2, further comprising an anti-ferromagnetic part which applies an exchange magnetic bias to at least one of the first and second ferromagnetic substance.

9. A magnetic logic device comprising:
a first hard magnetic part including a first ferromagnetic substance pinned in magnetization substantially in a first direction;
a second hard magnetic part including a second ferromagnetic substance pinned in magnetization substantially in a second direction;
a MR intermediate part provided between the first and second hard magnetic parts;
a first soft magnetic part provided between the first hard magnetic part and the MR intermediate part, and having a third ferromagnetic substance;
a second soft magnetic part provided between the second hard magnetic part and the MR intermediate part, and having a fourth ferromagnetic substance;
a first spin transfer intermediate part provided between the first hard magnetic part and the first soft magnetic part;
a second spin transfer intermediate part provided between the second hard magnetic part and the second soft magnetic part; and
a controlling unit which passes a first writing current between the first hard magnetic part and the first soft magnetic part in correspondence with a combination of a first logic input signal and a second logic input signal to direct a magnetization of the third ferromagnetic substance in a direction substantially parallel or anti-parallel to the first direction,
the controlling unit reading a logic output based on a relative relation of the directions of magnetizations of the third and fourth ferromagnetic substances, by passing a sense current between the first and second soft magnetic parts.

10. A magnetic logic device according to claim 9, wherein a spin-polarized electronic current flows in the first soft magnetic part by passing the first writing current, and the magnetization of the third ferromagnetic substance is directed in the direction parallel or anti-parallel by the first spin-polarized electronic current.

11. A magnetic logic device according to claim 9, wherein a resistance measured by the sense current varies depending on the relative relation of the directions of magnetizations of the third and fourth ferromagnetic substances.

12. A magnetic logic device comprising:
a first hard magnetic part including a first ferromagnetic substance pinned in magnetization substantially in a first direction;
a second hard magnetic part including a second ferromagnetic substance pinned in magnetization substantially in a second direction;
a soft magnetic part provided between the first and the second hard magnetic parts, and having a third ferromagnetic substance;
a spin transfer intermediate part provided between the first hard magnetic part and the soft magnetic part;
a MR intermediate part provided between the second hard magnetic parts and the soft magnetic part; and
a controlling unit which passes a first writing current between the first hard magnetic part and the soft magnetic part in correspondence with a combination of a first logic input signal and a second logic input signal to direct a magnetization of the third ferromagnetic substance in a direction substantially parallel or anti-parallel to the first direction,
the controlling unit reading a logic output based on a relative relation of the directions of magnetizations of the second and the third ferromagnetic substances, by passing a sense current between the soft magnetic part and the second hard magnetic part.

13. A magnetic logic device according to claim 12, wherein a spin-polarized electronic current flows in the soft magnetic part by passing the first writing current, and the magnetization of the third ferromagnetic substance is directed in the direction parallel or anti-parallel by the first spin-polarized electronic current.

14. A magnetic logic device according to claim 12, wherein a resistance measured by the sense current varies depending on the relative relation of the directions of magnetizations of the second and the third ferromagnetic substances.

15. A magnetic logic device comprising:
a first hard magnetic part including a first ferromagnetic substance pinned in magnetization substantially in a first direction;
a second hard magnetic part including a second ferromagnetic substance pinned in magnetization substantially in a second direction;
a soft magnetic part provided between the first and the second hard magnetic parts, and having a third ferromagnetic substance;
a spin transfer intermediate part provided between the first hard magnetic part and the soft magnetic part;
a MR intermediate part provided between the second hard magnetic parts and the soft magnetic part; and
a controlling unit which applies a first voltage to one of the first hard magnetic part and the soft magnetic part in correspondence with a first logic input signal, and applies a second voltage to another of the first hard magnetic part and the soft magnetic part in correspondence with a second input signal, a writing generated by a difference between the first and the second voltages directing a magnetization of the third ferromagnetic substance in a direction substantially parallel or anti-parallel to the first direction, and the controlling unit reading a logic output based on a relative relation of the second direction and the direction of the magnetization of the third ferromagnetic substance, by passing a sense current between the soft magnetic part and the second hard magnetic part.

16. A magnetic logic device according to claim 15, wherein a spin-polarized electronic current flows in the soft magnetic part by passing the writing current, and the magnetization of the third ferromagnetic substance is directed in the direction parallel or anti-parallel by the first spin-polarized electronic current.

17. A magnetic logic device according to claim 15, wherein a resistance measured by the sense current varies depending on the relative relation of the second direction and the direction of the magnetizations of the third ferromagnetic substance.

* * * * *